US 12,164,144 B2

(12) United States Patent
Hnatovsky et al.

(10) Patent No.: US 12,164,144 B2
(45) Date of Patent: Dec. 10, 2024

(54) FIBER BRAGG GRATING SENSOR IN POLYMER-COATED ULTRA-THIN OPTICAL FIBERS AND METHOD FOR PRODUCING SAME

(71) Applicant: NATIONAL RESEARCH COUNCIL OF CANADA, Ottawa (CA)

(72) Inventors: Cyril Hnatovsky, Ottawa (CA); Nurmemet Abdukerim, Ottawa (CA); Dan Grobnic, Ottawa (CA); Stephen Mihailov, Ottawa (CA); Rune Lausten, Ottawa (CA); Ping Lu, Ottawa (CA); Huimin Ding, Ottawa (CA); David Coulas, Ottawa (CA); Kasthuri De Silva, Ottawa (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 217 days.

(21) Appl. No.: 17/924,434

(22) PCT Filed: May 13, 2020

(86) PCT No.: PCT/IB2020/054544
§ 371 (c)(1),
(2) Date: Nov. 10, 2022

(87) PCT Pub. No.: WO2021/229269
PCT Pub. Date: Nov. 18, 2021

(65) Prior Publication Data
US 2023/0194775 A1 Jun. 22, 2023

(51) Int. Cl.
*G02B 6/02* (2006.01)
*G02B 5/18* (2006.01)

(52) U.S. Cl.
CPC ....... *G02B 6/02138* (2013.01); *G02B 5/1857* (2013.01)

(58) Field of Classification Search
None
See application file for complete search history.

(56) References Cited

U.S. PATENT DOCUMENTS

| 4,807,950 A | 2/1989 | Glenn et al. |
| 5,287,427 A | 2/1994 | Atkins et al. |

(Continued)

FOREIGN PATENT DOCUMENTS

| CA | 2369953 A1 | 7/2003 |
| CA | 2436499 C | 4/2012 |

(Continued)

OTHER PUBLICATIONS

PCT/IB2020/054544, Fiber Bragg Grating Sensor in Polymer-Coated Ultra-Thin Optical Fibers and Producing Same.

(Continued)

*Primary Examiner* — Jerry Rahll
(74) *Attorney, Agent, or Firm* — PERRY + CURRIER INC.

(57) ABSTRACT

A method and apparatus for inscribing a Bragg grating in an optical waveguide, comprising: providing electromagnetic radiation from an ultrashort pulse duration laser, wherein the electromagnetic radiation has a pulse duration of less than or equal to 5 picoseconds, and wherein the wavelength of the electromagnetic radiation has a characteristic wavelength in the wavelength range from 150 nanometers (nm) to 2.0 microns (μm): providing cylindrical focusing optics corrected for spherical aberration: providing a diffractive optical element that when exposed to the focused ultrashort laser pulse, creates an interference pattern on the optical waveguide, wherein the irradiation step comprises irradiating a surface of the diffractive optical element with the focused electromagnetic radiation, the electromagnetic radiation incident on the optical waveguide, from the diffractive optical element, being sufficiently intense to cause the (Continued)

permanent change in the index of refraction in the core of the optical waveguide.

31 Claims, 12 Drawing Sheets

(56) References Cited

U.S. PATENT DOCUMENTS

| | | | |
|---|---|---|---|
| 5,367,588 | A | 11/1994 | Hill et al. |
| 5,478,371 | A | 12/1995 | Lemaire et al. |
| 6,297,894 | B1 | 10/2001 | Miller et al. |
| 6,633,419 | B2 | 10/2003 | Hosono et al. |
| 6,878,900 | B2 | 4/2005 | Corkum et al. |
| 6,884,960 | B2 | 4/2005 | Bourne et al. |
| 6,993,221 | B2 | 1/2006 | Mihailov et al. |
| 7,031,571 | B2 | 4/2006 | Mihailov et al. |
| 7,033,519 | B2 | 4/2006 | Taylor et al. |
| 7,379,643 | B2 | 5/2008 | Mihailov et al. |
| 7,438,824 | B2 | 10/2008 | Taylor et al. |
| 7,483,615 | B2 | 1/2009 | Mihailov et al. |
| 7,515,792 | B2 | 4/2009 | Mihailov et al. |
| 7,606,452 | B2 | 10/2009 | Bilodeau et al. |
| 7,689,087 | B2 | 3/2010 | Mihailov et al. |
| 8,272,236 | B2 | 9/2012 | Smelser et al. |
| 8,402,789 | B2 | 3/2013 | Smelser et al. |
| 8,727,613 | B2 | 5/2014 | Mihailov |
| 10,132,994 | B2 | 10/2018 | Bernier et al. |
| 10,156,680 | B2 | 12/2018 | Grobnic et al. |
| 2003/0142911 | A1* | 7/2003 | Postolek ............ G02B 6/02204 385/27 |
| 2003/0174947 | A1* | 9/2003 | Sweetser ............ G02B 6/02152 430/290 |
| 2004/0184731 | A1* | 9/2004 | Mihailov ............... G02B 6/124 430/290 |
| 2004/0184734 | A1* | 9/2004 | Mihailov ............. G02B 5/1857 385/37 |
| 2017/0090289 | A1* | 3/2017 | Yajima ...................... G03F 7/22 |
| 2017/0192168 | A1* | 7/2017 | Grobnic .............. B23K 26/355 |
| 2018/0067254 | A1* | 3/2018 | Mihailov ............... G02B 6/262 |
| 2019/0049272 | A1 | 2/2019 | Grobnic et al. |
| 2020/0054485 | A1* | 2/2020 | Knox ................... B23K 26/082 |
| 2020/0166698 | A1* | 5/2020 | Fells .................. G02B 6/02147 |
| 2021/0052425 | A1* | 2/2021 | Knox .................. A61F 9/00827 |
| 2021/0318488 | A1* | 10/2021 | Hnatovsky ......... G02B 6/02138 |

FOREIGN PATENT DOCUMENTS

| | | |
|---|---|---|
| EP | 1462831 B1 | 5/2008 |
| WO | WO-03079076 A2 | 9/2003 |
| WO | WO-2017141188 A1 | 8/2017 |

OTHER PUBLICATIONS

Abdukerim, Nurmemet, et al. "Complex diffraction and dispersion effects in femtosecond laser writing of fiber Bragg gratings using the phase mask technique." Optics Express 27.22 (2019): 32536-32555.
Bernier, M., et al. "High mechanical strength fiber Bragg gratings made with infrared femtosecond pulses and a phase mask." Optics letters 39.12 (2014): 3646-3649.
Grobnic, Dan, et al. "Ultrafast IR laser writing of strong Bragg gratings through the coating of high Ge-doped optical fibers." IEEE Photonics Technology Letters 20.12 (2008): 973-975.
Harvey, James E. et al. "Aberrations of diffracted wave fields: distortion." Applied optics 42.7 (2003): 1167-1174.
Hnatovsky, Cyril et al. "Nonlinear photoluminescence imaging applied to femtosecond laser manufacturing of fiber Bragg gratings." Optics express 25.13 (2017): 14247-14259.
Hnatovsky, Cyril et al. "Through-the-coating femtosecond laser inscription of very short fiber Bragg gratings for acoustic and high temperature sensing applications." Optics Express 25.21 (2017): 25435-25446.
Martinez, Amos et al. "Direct inscription of Bragg gratings in coated fibers by an infrared femtosecond laser." Optics letters 31.11 (2006): 1603-1605.
Mihailov, S. J. et al. "Efficient grating writing through fibre coating with femtosecond IR radiation and phase mask." Electronics Letters 43.8 (2007): 1.
Mihailov, Stephen J., et al. "Bragg grating writing through the polyimide coating of high NA optical fibres with femtosecond IR radiation." Optics communications 281 (2008): 5344-5348.
Torok, P., et al. "Electromagnetic diffraction of light focused through a planar interface between materials of mismatched refractive indices: an integral representation." Josa A 12.2 (1995): 325-332.
Habel, Joé, et al. "Femtosecond FBG Written through the Coating for Sensing Applications." Sensors 17 (2017): 2519.
Grobnic, Dan et al. "Thermally stable type II FBGs written through polyimide coatings of silica-based optical fiber." IEEE Photonics Technology Letters 29.21 (2017): 1780-1783.

* cited by examiner

FIBER BRAGG GRATING SENSOR IN POLYMER-COATED ULTRA-THIN OPTICAL FIBERS AND METHOD FOR PRODUCING SAME

BACKGROUND OF THE INVENTION

1. Field of the Invention

The present invention relates in general to the formation of fiber Bragg gratings in optical waveguides and to sensing apparatus comprising such gratings, and more particularly to a method of inscribing a Bragg grating in an optical waveguide using femtosecond (fs) pulse duration lasers and specialized transmission diffraction elements and/or phase masks.

2. Background of the Invention

Fiber Bragg gratings are simple, intrinsic sensing elements which traditionally have been photo-inscribed into photosensitive germanium-doped (Ge-doped) fibers. Fiber Bragg grating (FBG) sensors are useful for performing quasi-distributed temperature and strain measurements along an optical waveguide (e.g. optical fiber). The grating structure acts as a band-rejection optical filter passing all wavelengths of light not in resonance with it and reflecting those that satisfy the Bragg condition of the core index modulation, namely:

$$\lambda_B = 2n_{eff}\Lambda_G \quad (1)$$

where $\lambda_B$ is the FBG Bragg resonance or Bragg wavelength, $n_{eff}$ is the effective refractive index seen by the guided mode of light propagating down the fiber, and $\Lambda_G$ is the period of the index modulation that makes up the Bragg grating. Variations in the spectral response of the grating result from period changes in the Bragg grating due to strains or temperature variations that are experienced by the optical fiber when placed in a specific environment. As such, the FBG optical filter can act as a sensor and offer important advantages over other sensor technologies because of their electrically passive operation, electromagnetic interference (EMI) immunity, high sensitivity and multiplexing capabilities.

Fiber Bragg gratings are simple, intrinsic sensing elements which traditionally have been photo-inscribed into photosensitive Ge-doped silica fiber using high-power ultraviolet (UV) laser sources. Each FBG sensor has a characteristic retro-reflective Bragg resonance or Bragg resonance wavelength, which is dependent upon the periodicity of the grating photo-inscribed within the fiber and the effective refractive index $n_{eff}$ of the fundamental core mode of the optical fiber. The FBG sensors can then easily be multiplexed in a serial fashion along a length of single fiber to produce a quasi-distributed optical fiber sensor array. When produced in thin optical fiber filaments (hereinafter, a fiber filament is a an optical fiber with a cladding diameter ≤50 micrometers) and embedded into composite materials, optical fiber filaments with an array of FBG sensors allow for distributed measurements of load, strain, temperature and vibration of the material creating what has is commonly referred to as "smart structures" where the health and integrity of the structure is monitored on a real-time basis. Because of the small form factor of the optical fiber filament with respect to typical carbon fibers used in composite materials, integration of the fiber filament does not result in potential delamination sites of the composite.

Typically, fiber Bragg gratings are generated by exposing the UV-photosensitive core of a germanium doped silica core optical fiber to a spatially modulated UV laser beam in order to create permanent refractive index changes in the fiber core. Such a spatially modulated UV beam can be created using a two-beam interference technique as disclosed in U.S. Pat. No. 4,807,950 by Glenn et al. or by using a phase mask as disclosed in U.S. Pat. No. 5,367,588 by Hill et al. The techniques taught by Glenn and Hill result in gratings that are typically referred to as Type I gratings.

A limitation of the prior-art UV-induced Type I FBGs, especially for high temperature sensor applications, is that operation of the sensor at elevated temperatures results in removal or annealing of the UV-induced color centers and densification which are responsible for the induced index change of the grating. In fact, at temperatures approaching the glass transition temperature of the fiber, which for silica is approximately 1200° C., total removal of the induced index modulation results.

Another limitation of UV-induced FBGs is associated with the necessity to use UV laser radiation for FBG inscription in Ge-doped silica fibers. The standard polymer coatings that are typically used to protect optical fibers, for example acrylate or polyimide, must be removed as they highly absorb UV light. Stripping and reapplication of polymer coatings before and after the FBG inscription are time consuming processes that weaken the mechanical integrity of the optical fiber. Furthermore, UV laser inscription requires the optical fiber to be photosensitized using a process of 'hydrogen loading', as taught by Atkins et al. in U.S. Pat. No. 5,287,427 and Lemaire et al. in U.S. Pat. No. 5,478,371, in order to increase sensitivity of the optical fiber to UV radiation.

In order to photo-imprint retroreflective Bragg structures into the core of optical fibers or waveguides using high-intensity femtosecond time duration radiation, it is advantageous to generate an interference fringe pattern originating from a single femtosecond laser pulse using either a holographic technique or a diffractive optic. Hosono et al. in U.S. Pat. No. 6,633,419, incorporated herein by reference, disclose an apparatus for producing a hologram using a two-beam laser interference exposure process and a femtosecond laser having a pulse width of 10 to 900 femtoseconds and a peak output of 1 GW or more that is capable of generating a pulse beam at or close to the Fourier transform limit. The beam from the laser is divided into two beams using a beam splitter, controlled temporally through an optical delay circuit and spatially using plane and concave mirrors each having a slightly rotatable reflection surfaces to converge the beams on a surface of or within a substrate for recording a hologram at an energy density of 100 GW/cm$^2$ or more while keeping each polarization plane of the two beams in parallel so as to match the converged spot of the two beams temporally and spatially, such that a hologram is recorded irreversibly on the substrate formed of a transparent material, semiconductor material or metallic material. The volume hologram is optionally layered so as to provide a multiplex hologram recording that is permanent (unless heated to a temperature sufficient to cause structural change in the atomic arrangement of the substrate in which the hologram is inscribed).

Miller et al., in U.S. Pat. No. 6,297,894, incorporated herein by reference, teach a method of utilizing a diffractive optic to generate an interference fringe pattern in order to induce refractive index changes in materials using femtosecond time duration laser radiation. An exemplary embodiment set forth in Miller et al. comprises a femtosecond laser source for providing light to a diffractive optical element. Light propagating from the diffractive optical element is incident on a curved mirror, which acts to focus the light into a lens or another curved mirror and then into a target.

Mihailov et al. in U.S. Pat. No. 6,993,221, incorporated herein by reference, disclose a technique for fabrication of Bragg grating structures in optical media such as optical fibers and waveguides with an ultrafast (<500 ps) laser source and a zero-order-nulled phase mask using a direct writing technique. The resultant grating structures have high induced index modulations ($>1\times10^{-3}$) which can be achieved without any special fiber sensitization process such as those taught by Atkins et al. in U.S. Pat. No. 5,287,427. Since the refractive index change need not be dependent on the dopant in the core or cladding of the waveguide, refractive index changes can be induced in both regions of the waveguide. By using a femtosecond laser source, fabricating the Bragg gratings is not limited to optical fibers or waveguides that are only photosensitive to UV light, which is typically Germanium doped silica glass. The multiphoton nature of the induced index change process, as taught by Mihailov et al in U.S. Pat. No. 6,993,221, can be applied to any material that is transmissive to femtosecond radiation, for example pure silica glass, or crystalline sapphire. The fabrication of Bragg gratings using infrared (IR) ultrafast radiation and a phase mask, as taught by Mihailov et al in U.S. Pat. No. 6,993,221 can result in high-temperature stable Bragg gratings with very high index modulations ($\Delta n>10^{-3}$).

Mihailov et al. in U.S. Pat. No. 7,031,571, incorporated herein by reference, teach that when using a transmission diffraction grating (phase mask) and a femtosecond pulse duration laser source to fabricate a Bragg grating in an optical fiber, there is an optimal fiber-phase mask distance L that is dependent on the concept of 'group-velocity' walk-off of the diffracted orders with respect to each other. The group velocity walk-off results in pure 2-beam interference within the optical fiber when irradiated with femtosecond time duration light pulses, wherein L is chosen such that the difference in times of arrival of the diffracted order pairs from the phase mask, due to group velocity walk-off, results in a pure 2-beam interference pattern of sub-beams of the pulse of light that have passed through or reflected off of the mask.

Mihailov et al. further teach that when the fs laser source operates in the infrared portion of the spectrum, the technique taught in U.S. Pat. No. 7,031,571 can be applied to inscribe FBGs directly through the polymer coatings without having to remove them.

In the method taught by Mihailov et al. in U.S. Pat. No. 7,031,571, fs-laser inscription of FBGs using phase masks relies on large diffraction angles, which is the necessary condition for the creation of small-period (<1 μm) interference patterns to be imprinted into the material for near-infrared femtosecond pulses. Surprisingly, despite the fact that FBGs fabricated by means of focusing fs-radiation through a phase mask have been used for many scientific and industrial applications for more than a decade, the obvious relevance of chromatic dispersion of the mask and potential limitations imposed by it on this important laser writing technique have never been discussed in the literature.

Moreover, the prior art also does not contemplate another neglected set of phenomena that is inherent to the phase mask technique regardless of whether the laser radiation used for FBG inscription is broadband (as in the case of femtosecond lasers with pulse durations <80 fs) or narrow-band (as in the case of UV excimer or continuous-wave lasers). The plane-parallel phase mask substrate introduces negative spherical aberration to the laser beam even when the focusing optics (i.e., cylindrical lens) is corrected for spherical aberration, as discussed for example by Török, et. al in "Electromagnetic diffraction of light focused through a planar interface between materials of mismatched refractive indices: an integral representation," J. Opt. Soc. Am. A 12 (2), 325-332 (1995). When the cylindrical lens focuses the laser beam tightly, which is required for the inscription of FBGs through the protective fiber coating in the case of fs-beams, the magnitude of the negative spherical aberration can be quite significant even for thin mask substrates. This is especially a problem for very narrow optical fiber filaments (≤50 μm in diameter) where laser light intensity differentials between the polymer-coated fiber surface and the fiber center are harder to achieve. Additionally, focusing of a laser beam through a phase mask implies that the associated diffraction should be considered within the framework of conical diffraction or off-plane diffraction. Again, the magnitude of the off-plane diffraction phenomenon increases dramatically for tight focusing geometries.

The inventors have recognized a need for fiber Bragg gratings that can be made polymer-coated fiber filaments that are not photosensitive to the UV, where important effects of chromatic aberration, spherical aberration, chromatic dispersion and conical diffraction associated with the phase mask technique are considered and optimized in order to produce Bragg grating in the polymer-coated optical fiber filaments.

SUMMARY OF THE INVENTION

As set forth below, a method for inscribing a Bragg grating in an optical waveguide: s described, comprising the steps of: providing the optical waveguide; providing electromagnetic radiation from an ultrashort pulse duration laser, wherein the electromagnetic radiation has a pulse duration of less than or equal to 5 picoseconds, and wherein the wavelength of the electromagnetic radiation has a characteristic wavelength in the wavelength range from 150 nanometers (nm) to 2.0 microns (μm); providing cylindrical focusing optics corrected for spherical aberration; providing a diffractive optical element that when exposed to the focused ultrashort laser pulse, creates an interference pattern on the optical waveguide, wherein the irradiation step comprises irradiating a surface of the diffractive optical element with the focused electromagnetic radiation, the electromagnetic radiation incident on the optical waveguide, from the diffractive optical element, being sufficiently intense to cause the permanent change in the index of refraction in the core of the optical waveguide.

The described method further comprises a step of positioning the optical waveguide at a special distance with respect to the phase mask along the beam propagation direction where the confocal parameter of the line-shaped laser focus is smallest and the peak intensity in the focus is highest, which takes place at said special distance where i) effects of chromatic dispersion, spherical aberration and conical diffraction from the phase mask and ii) chromatic aberration from the focusing elements cancel each other out or significantly minimized; irradiating the optical waveguide with the electromagnetic radiation to form a Bragg grating, the electromagnetic radiation incident on the optical waveguide being sufficiently intense to cause a permanent change in an index of refraction within a core of the optical waveguide when exposed to a single pulse or a succession of laser pulses.

Additionally, an optical waveguide is set forth with an inscribed Bragg grating prepared according to the method as described herein.

Furthermore, an optical waveguide is set forth with an inscribed Bragg grating, wherein the Bragg grating is stable at a temperature up to the glass transition temperature of the optical waveguide.

In the present application, references to "a permanent change in an index of refraction within a core of the optical waveguide" represents the formation of a Bragg grating that is stable at high temperatures. For example, Bragg gratings written in silica-based optical fibers under certain laser exposure conditions remain stable at a temperature up to 600-700° C. This is also referred to herein and in the art as a Type I Bragg grating. In one embodiment, a Type I grating is one which is substantially removed by heating at temperatures of up to 1000° C. In some embodiments, Type I gratings are substantially erased at temperatures lower than 1000° C., for example 800° C.

In the present application, references to "a permanent change in an index of refraction within a core of the optical waveguide" can also represent the formation of a grating that is stable at a temperature up to just below the glass transition temperature of the material forming the optical waveguide being inscribed with the Bragg grating. This is also referred to herein and in the art as a Type II grating. In one embodiment, where the waveguide is a silica-based fiber, a permanent change in an index of refraction within a core of the optical waveguide is one which is stable at temperatures of up to 1000° C. In other embodiments, where the optical waveguide comprises a different material (e.g. crystalline sapphire), the temperature may be higher than 1000° C.

Several aspects of the invention are as follows:

A method for inscribing a Bragg grating in an optical waveguide, comprising the steps of: providing electromagnetic radiation from an ultrashort pulse duration laser; providing a focusing optical element to focus the electromagnetic radiation from an ultrashort pulse duration laser; providing a diffractive optical element that when exposed to the focused electromagnetic radiation generates a beam on the optical waveguide having an interference pattern; positioning the optical fiber at a distance with respect to the diffractive optical element where the confocal parameter of a line-shaped laser focus created by the focusing optical element is smallest and the peak intensity in the focus is highest due to substantial or complete cancelation of i) negative spherical aberration and conical diffraction caused by the diffractive optical element and ii) chromatic aberration of the focusing element and chromatic dispersion of the diffractive optical element; and irradiating the optical waveguide with the electromagnetic radiation to form a Bragg grating, the electromagnetic radiation incident on the optical waveguide being sufficiently intense to cause Type I or Type II permanent change in the index of refraction within a core of the optical waveguide when exposed to a single pulse or a succession of laser pulses.

Apparatus for inscribing a Bragg grating in an optical waveguide, comprising: an ultrashort pulse duration laser for providing electromagnetic radiation; a focusing optical element to focus the electromagnetic radiation from an ultrashort pulse duration laser; and a diffractive optical element that when exposed to the focused electromagnetic radiation from the focusing element produces an interference pattern in the optical waveguide: wherein positioning the optical waveguide at a special distance with respect to the diffractive optical element along the propagation direction of the electromagnetic radiation where the confocal parameter of line-shaped laser focus is smallest and the peak intensity in the focus is highest results in the effects of i) negative spherical aberration and conical diffraction caused by the diffractive optical element and ii) chromatic aberration of the focusing element and chromatic dispersion of the diffractive optical element substantially or completely cancelling each other out; and wherein irradiating the optical waveguide with the electromagnetic radiation forms a Bragg grating, the electromagnetic radiation incident on the optical waveguide being sufficiently intense to cause a Type I or Type II permanent change in an the index of refraction within a core of the optical waveguide when exposed to a single pulse or a succession of laser pulses.

These together with other aspects and advantages, as well as a discussion of the prior art, are more fully set forth below, reference being had to the accompanying drawings forming a part hereof, wherein like numerals refer to like parts throughout.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 11a is a reflection spectrum of a Type I FBG written (with the 12 mm focal-length cylindrical lens corrected for spherical aberration) in a 50 µm diameter optical fiber with a 10 µm thick polyimide coating using a method according to an embodiment, where the total reflection of the grating is 75% (−6 dB in transmission).

FIG. 11b is an optical microscopy image of a 50 µm fiber with a 10 µm thick polyimide coating containing the Type I FBG whose spectrum is shown in FIG. 11a.

DETAILED DESCRIPTION OF THE PREFERRED EMBODIMENTS

It is an object of an aspect of this specification to provide for fabrication of FBG sensors in small diameter optical fibers and optical fiber tapers. It is another object of an aspect of this specification to provide for fabrication of FBG sensors in small diameter optical fibers and optical fiber tapers when said optical fibers and optical fiber tapers are non-photosensitized (i.e. no hydrogen or deuterium loading) and polymer-coated. Such sensors can be used for measurement of pressure, strain, temperature, or displacement or index of refraction. Advantageously, when fabricated in silica-based waveguide filaments, such sensors can also be made to have high thermal stability, for example up to 1000° C. They can also be easily integrated into composite materials to create 'smart skins'.

Figure 1:
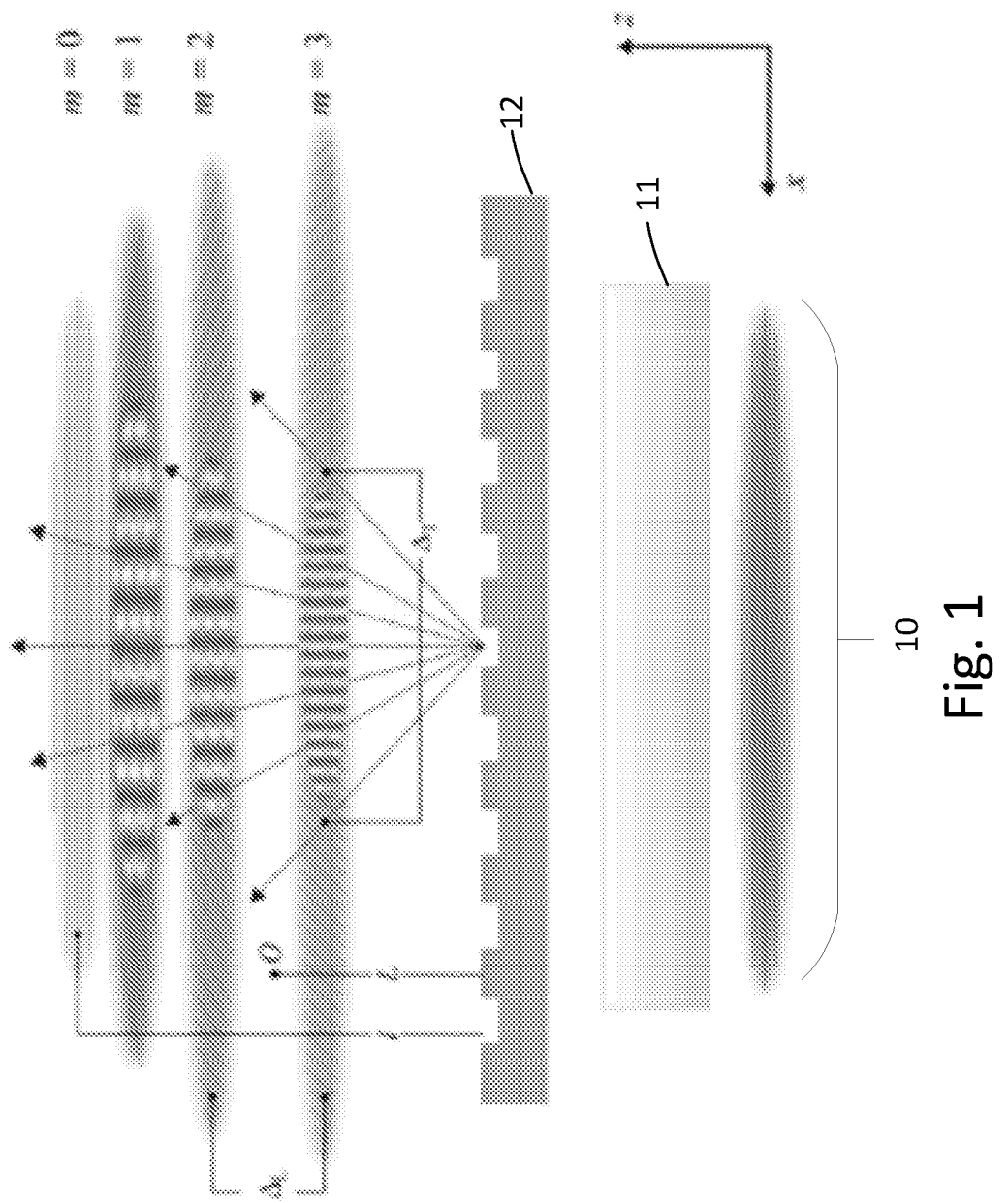
FIG. 1 depicts an interferometric setup for the inscription of a fiber Bragg grating in an optical waveguide, according to an aspect of this specification.

FIG. 1 depicts an interferometric setup for the inscription of a fiber Bragg grating in an optical waveguide, according to an aspect of this specification. An incident femtosecond beam 10 from an ultrashort pulse duration laser is focused by a cylindrical lens corrected for spherical aberration 11 onto a uniformly pitched phase mask 12. Hereinafter, the cylindrical lens corrected for spherical aberration is referred to as a cylindrical lens. Interference of the ultrashort pulses by the phase mask 12 produces multiple diffraction orders (m=0, . . . 3), where $\Delta_T$ is the transverse walk-off and $\Delta_L$ is the longitudinal walk-off, as discussed in greater detail below with reference to FIG. 2b, L is the distance from the mask 12 to an observation point (O) and/is the distance from the mask 12 to the pulse front of the $0^{th}$ diffraction order. In FIG. 1, the pulse phase fronts are normal to the propagation direction of the respective diffraction orders.

Figure 2A:
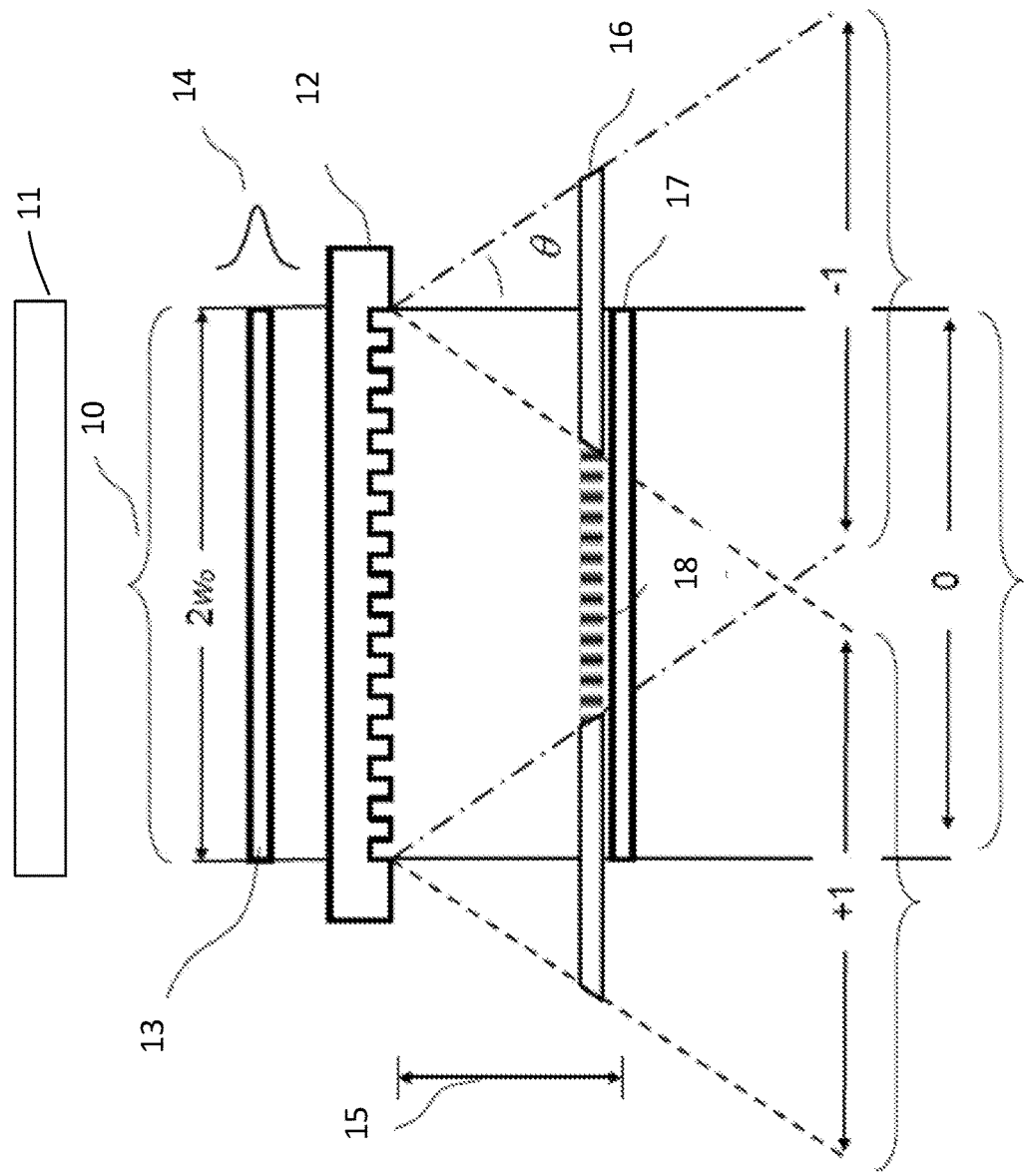
FIG. 2a depicts the transverse and longitudinal order walk-off effect from a uniform phase mask of diffracted femtosecond pulses.

As taught by Mihailov et al. in U.S. Pat. No. 7,031,571, femtosecond pulses interact differently with a transmission diffraction grating or phase mask when compared to continuous wave (CW) UV sources. In FIG. 2 a), the incident femtosecond beam 10 with a width $2w_0$, impinges on the phase mask 12 at normal incidence. The femtosecond beam 10 is composed of a number of femtosecond light pulses 13 which have a spatial dimension or pulse envelope of the electromagnetic radiation 14 which is dependent on the pulse duration. For example, a 100 femtosecond pulse has a 30 µm width of its electromagnetic pulse envelope in the direction of the beam propagation. On passing through the phase mask, the femtosecond beam 10 is split into a number of beams that is dependent upon the periodicity $\Lambda_M$ of the corrugation structure of the mask and the wavelength $\lambda_0$ of the femtosecond beam such that:

$$\theta = \sin^{-1}\left(\frac{m\lambda_o}{\Lambda_M}\right) \quad (2)$$

where m is the order number of the diffracted beam and is an integer satisfying the condition $|\lambda_0 \cdot m/\Lambda_M| \leq 1$ in order to ensure the existence of propagating (rather than evanescent) diffraction orders. For example, a phase mask 12 that has a nominal periodicity of 1.071 µm when irradiated with 800 nm infrared radiation at normal incidence will produce 3 femtosecond beams related to the diffracted orders of the mask, namely a $0^{th}$ order that is in line with the incident beam and +1 and −1 orders that diffract with angles θ~±48° with respect to the normal to the mask. By optimizing the depth of the troughs of the corrugation pattern of the mask with respect to the wavelength of the irradiating beam, coupling of the incident beam energy into the ±1 orders can be maximized. At the phase mask surface, the generated pulses in each of the diffracted orders overlap spatially. The pulses propagate away from the surface at the speed of light along the beam path defined by the diffracted order. At a given distance L (15 in FIG. 2a) from the phase mask 12, the projection of the propagating ±1 orders 16 on to the normal of the mask no longer overlap with the 0 order 17. Only the portions of the ±1 orders that overlap will interfere resulting in a sinusoidal interference pattern 18. This is the longitudinal order walk-off effect taught by Mihailov in U.S. Pat. No. 7,031,571. For the example of the 1.071 µm pitched phase mask referred to above, irradiated with 100 fs pulse duration 800 nm infrared radiation, the walk-off distance 15 is ~90 µm from the mask surface.

Expressed mathematically, at a certain distance L (15), a pure two-beam interference pattern 18 (with a period $\Lambda_G = \Lambda_M/2$) produced by the pulses in the +m and −m diffraction orders will begin to emerge. This happens when the following condition is satisfied:

$$L \geq \frac{\lambda_o^2}{\Delta\lambda} \frac{\cos\left(\sin^{-1}\left(\frac{m\lambda_o}{\Lambda_M}\right)\right)}{\cos\left(\sin^{-1}\left(\frac{(m-1)\lambda_o}{\Lambda_M}\right)\right) - \cos\left(\sin^{-1}\left(\frac{m\lambda_o}{\Lambda_M}\right)\right)} \quad (3)$$

where $\Delta\lambda$ is the FWHM (full width at half maximum) bandwidth of the fs-pulses and m is assumed to be positive. Equation (3) simply states that when the separation of the pulse fronts of the $m^{th}$ and $(m-1)^{th}$ order along the beam propagation direction, exceeds the coherence length of the fs-pulses (i.e., $\lambda_o^2/\Delta\lambda$), the multi-beam Talbot-like interference pattern produced by these two adjacent diffraction orders disappears. Importantly, when a time-integrating detector is used to observe the intensity distribution after the phase mask12, this effect is solely defined by the spectral bandwidth of the pulse (rather than its spectral phase) and, therefore, does not depend on whether the pulse is transform-limited or chirped. This also means that the minimum distance at which this effect can be observed with time-integrating detectors is identical for an ultrashort optical pulse and an incoherent broadband light with the same spectral density.

The lateral overlap of the ±m diffracted orders that defines the interference fringes 18, decreases as the diffracted orders propagate away from the mask. This geometric effect-neglecting spatial chirp introduced by it-is called transverse walk-off. The transverse walk-off $\Delta_T$ for the $m^{th}$ diffraction order can be calculated using the following expression $\Delta_T = 2 L \tan(\theta_m)$, where $\theta_m$ is the diffraction angle of the $m^{th}$ order.

There is, however, another effect (the chromatic effect) that is inherent to the phase mask technique inscription method set forth above. The chromatic effect originates from the broadband nature of the fs-pulse and depends on the chromatic dispersion of both the phase mask 12 and the focusing cylindrical lens 11. The angular spread $\Delta\theta_m$ of the spectrum in the $m^{th}$ order corresponding to $\Delta\lambda$ can be obtained by differentiating the grating equation. Hence, for normal incidence, this can be expressed as $$\Delta\theta_m = \frac{m}{\Lambda_M \cos(\theta_m)} \Delta\lambda.$$

Figure 2B:
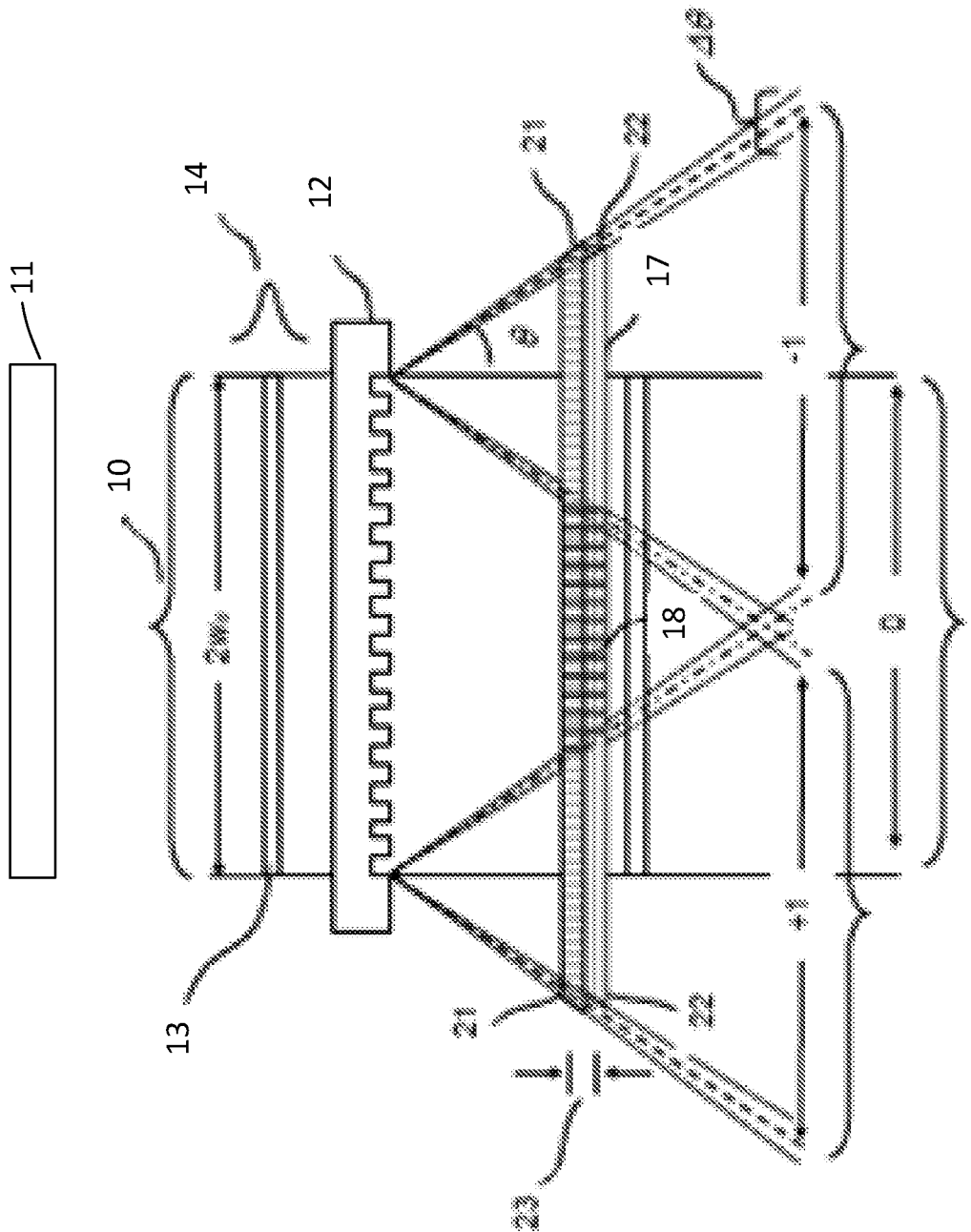
FIG. 2b depicts the longitudinal elongation of the focal spot caused by chromatic dispersion from the mask.

As Can be seen from FIG. 2b, the long-wavelength spectral components of the pulse 21 (denoted by vertical hash lines) are diffracted at a larger angle than the short-wavelength components 22 (denoted by horizontal hash lines) and the cylindrical lens 11 will therefore focus them closer to the mask 12. The difference in the positions of the 'blue' and 'red' foci along the z-axis 23 is given by:

$$\Delta z_{mask}^{chrom.} = L \frac{\sin(\theta_m)}{\cos(\theta_m)} \Delta\theta_m = \frac{mL\Delta\lambda}{\Lambda_M} \frac{\sin\left(\sin^{-1}\left(\frac{|m|\lambda_o}{\Lambda_M}\right)\right)}{\cos^2\left(\sin^{-1}\left(\frac{|m|\lambda_o}{\Lambda_M}\right)\right)} \quad (4)$$

The plane-parallel glass substrate on the surface of which the phase mask 12 is engraved introduces an additional chromatic focal elongation given in the paraxial approximation by:

$$\Delta z_{substr.}^{chrom.} = \frac{t}{n_1^2}(dn_1/d\lambda)\Delta\lambda \quad (5)$$

where t is the thickness of the mask substrate and mi is the refractive index of the mask substrate. As before, the substrate moves the 'red' focus closer to and the 'blue' focus farther from the mask 12, however this fixed elongation appears to be very small compared to the elongation caused by the mask and can be neglected.

Figure 3:
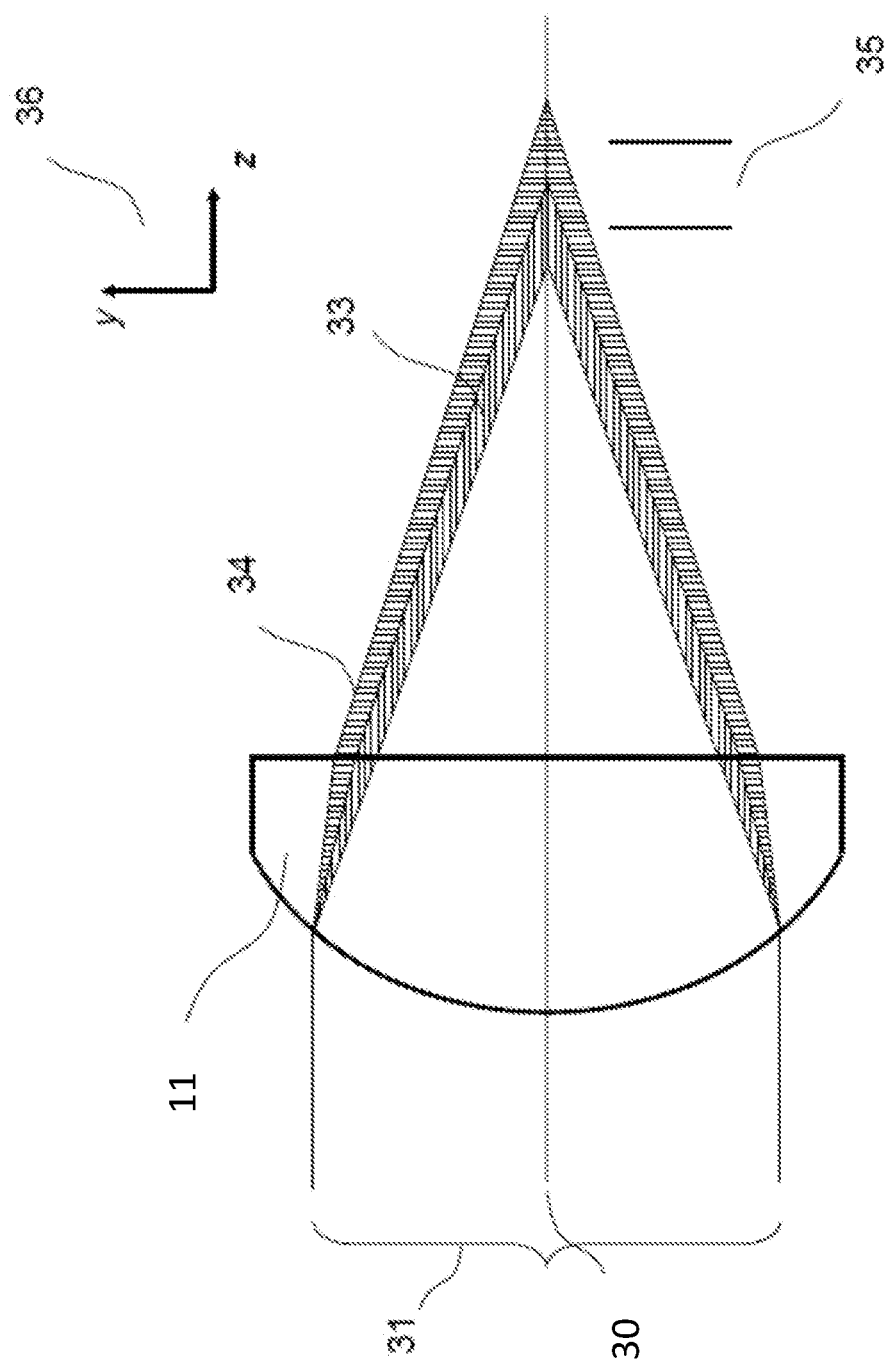
FIG. 3 depicts the chromatic aberration of the pulse due to a cylindrical lens.

The cylindrical lens also introduces a chromatic focal elongation along the beam propagation 30 or z axis 36, as denoted in FIG. 3. An incident fs pulse of beam diameter 31 propagates through cylindrical lens 11. Unlike the case of the chromatic elongation due to the phase mask, 'blue' spectral components 33 (denoted by horizontal hash lines in FIG. 3) are focused closer to the mask than their 'red' counterparts 34 (denoted by vertical hash lines in FIG. 3). This elongation is chromatic aberration 35, which can be written as:

$$\Delta z_{lens}^{chrom.} = -\frac{f}{n_2 - 1}(dn_1/d\lambda)\Delta\lambda \quad (6)$$

where f is the focal length of the cylindrical lens and $n_2$ is its refractive index. It can be shown that Eq. (6) remains valid even for thick lenses, provided that the lens shape is plano-convex. The latter condition is fulfilled, as set forth below. In the presence of an angularly dispersive element after the lens 11, i.e. phase mask 12, Eq. (6) needs to be modified as follows:

$$\Delta z_{lens}^{chrom.} = -\frac{f\cos(\theta_m)}{n_2 - 1}(dn_1/d\lambda)\Delta\lambda \quad (7)$$

Some salient features of the scenario when the phase mask technique is used with broadband fs-pulses can be summarized as follows:

First, the focal elongation $\Delta z_{mask}^{chrom.}$ caused by angular chromatic dispersion of the mask 12 linearly grows with the distance L from the mask and the bandwidth $\Delta\lambda$ of the fs-pulses. However, its dependence on the diffraction angle $\theta_m$ is essentially nonlinear, which becomes clear if Eq. (4) is rewritten in terms of m, d and $\lambda_0$ as:

$$\Delta z_{mask}^{chrom.} = \frac{m^2 \lambda_0 L \Delta\lambda}{\Lambda_M^2 - m^2 \lambda_0^2} \quad (8)$$

For instance, for a 3.21 μm-pitch mask 12 $\Lambda_M$, $\lambda_0$=800 nm and $\Delta\lambda$=10 nm, $\Delta z_{mask}^{chrom.}$ increases by ~0.1 μm for m=1, ~0.4 μm for m=2, and ~1.6 μm for m=3 when the observation point is moved every 100 μm away from the mask. To put it in perspective, Eq. (5) gives $\Delta z_{substr.}^{chrom.}$ ~0.2 μm for the same $\Delta\lambda$ and a fused silica ($SiO_2$) mask substrate of thickness t=3 mm ($n_1$=1.453 at $\lambda_0$=800 nm, $dn_1/d\lambda$=−0.0173 at $\lambda_0$=800 nm). It should be noted that the 10 nm-bandwidth in the above example is a 'round' number and does not represent experimental conditions.

Second, the focal elongation caused by chromatic aberration of the beam-focusing cylindrical lens 11 (see Eq. (6)) linearly depends on $\Delta\lambda$ for a given lens shape and lens material. Based on Eq. (6), chromatic aberration of the cylindrical lens used in the examples set forth herein (a plano-convex cylindrical lens with f=12 mm made of OHARA S-LAH64 glass; the curved surface of the lens is designed to correct spherical aberration in one dimension; $n_2$=1.776 at $\lambda_0$=800 nm, $dn_2/d\lambda$=−0.0371 μm$^{-1}$ at %=800 nm) is ~5.7 μm for $\Delta\lambda$=10 nm, since it does not concentrate incident light into one focal point, but instead along a focal line without the influence of spherical aberrations. According to Eq. (7), focusing through the 3.21 μm-pitch mask 12 will reduce this focal elongation by a factor of $\cos(\theta_m)$, making it ~5.6 μm for m=1, ~5.0 μm for m=2, and ~3.8 μm for m=3.

Third, if chromatic dispersion were the only cause of changing the focal intensity distribution of the fs-beam (which is not the case, as discussed below), there would exist a distance L from the mask 12 where $|\Delta z_{mask}^{chrom.}|=|\Delta z_{lens}^{chrom.}|$ and the confocal parameter of the line-shaped fs-laser focus would attain its minimum value. For given m and $\lambda_0$, this distance is solely determined by the mask-lens combination and does not depend on $\Delta\lambda$.

The cancelation of the two counteracting chromatic dispersions at a certain L would lead to a more pronounced sharpening of the fs-beam focus for tight-focusing geometries. This can be shown based on the following considerations. The peak intensity $I_0$ in the focus of a Gaussian beam is given by $I_0=4P/(\lambda_0 Z_0)$, where $P_0$ is the total power in the beam and $Z_0$ is the confocal parameter of the beam, which is twice the Rayleigh length. The presence of chromatic aberrations (and other aberrations, discussed below) elongates the confocal parameter by $\Delta Z$ and, as a result, decreases the peak intensity, which is given by $I_0'\approx 4P/[\lambda_0(Z_0+\Delta Z)]$. For a given $\Delta Z$, the ratio $I_0'/I_0$ can then be written as $I_0'/I_0 \propto (1+\Delta Z/Z_0)^{-1}$. Taking into account that $Z_0\approx 2\lambda_0/[\pi \sin^2(\varphi)]$ (or $Z_0\approx 2\lambda_0 \cos(\theta_m)/[\pi \sin^2(\varphi)]$ when focusing through mask 12), where $\varphi$ is the maximal half-angle of the cone of light (at the $1/e^2$-intensity level) that exits the focusing optics, a stronger sharpening for tightly focused beams becomes evident.

Figure 4:
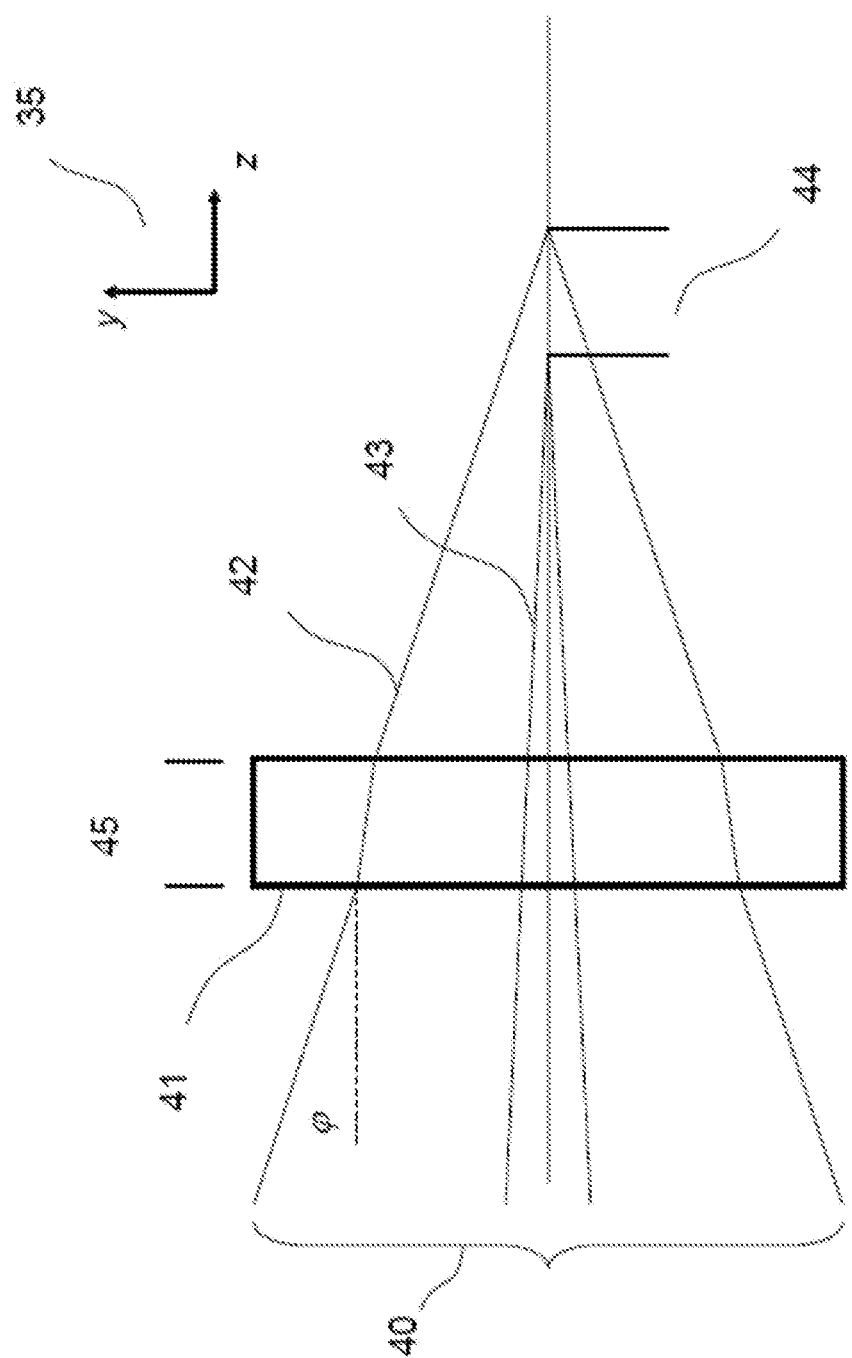
FIG. 4 depicts the elongation caused by the plane parallel mask substrate, wherein marginal rays are focused farther from the mask than paraxial rays.

In order to consider the effects associated with spherical aberration and conical diffraction, FIG. 4 denotes aberrations to a converging/diverging electromagnetic wave 40 produced by focusing/defocusing a light beam with a spherical or cylindrical lens 11 introduced by a plane parallel plate 41. When the beam axis is normal to the plate, only spherical aberration needs to be considered. This type of spherical aberration originates from the fact that rays that have a larger angle of incidence with respect to the normal to the plate (i.e., marginal rays 42 making angle q with the normal of the substrate) are displaced more along the beam propagation direction than rays that have a smaller angle of incidence (i.e., paraxial rays 43). The magnitude of such a longitudinal separation $\Delta z_{substr.}^{sph.aberr.}$ (44) between the marginal and paraxial foci is given by:

$$\Delta z_{substr.}^{sph.aberr.} = \frac{t}{n_1}\left\{1 - \left[\frac{n_1^2(1 - \sin^2(\varphi))}{n_1^2 - \sin^2(\varphi)}\right]^{1/2}\right\} \quad (9)$$

where t is the thickness 45 of the phase mask substrate. In the $3^{rd}$-order approximation Eq. (9) reduces to:

$$\Delta z_{substr.}^{sph.aberr.} = \frac{(n_1^2 - 1)t\varphi^2}{2n_1^3} \quad (10)$$

Even though Eqs. (9) and (10) provide no information about the intensity distribution in the focal volume, they define two shadow boundaries on the z-axis between which the light rays cross the z-axis and in this respect give a rough estimate of the focal volume extent in the beam propagation direction. The related geometric optics ray tracing formalism is schematically presented in FIG. 4.

The phase mask technique is inherently based on focusing a laser beam with a cylindrical lens 11 through a plane parallel glass plate 41 whose one surface is covered with periodic linear grooves and the effect of the above-mentioned spherical aberration should therefore be taken into account. Similarly to the case of lens-induced chromatic aberration represented by Eq. (7), Eq. (9) needs to be modified as follows:

$$\Delta z_{substr.}^{sph.aberr.} = \frac{t\cos(\theta_m)}{n_1}\left\{1 - \left[\frac{n_1^2(1 - \sin^2(\varphi))}{n_1^2 - \sin^2(\varphi)}\right]^{1/2}\right\} \quad (11)$$

In the $3^{rd}$-order approximation, Eq. (11) reads:

$$\Delta z_{substr.}^{sph.aberr.} = \frac{(n_1^2 - 1)t\cos(\theta_m)\varphi^2}{2n_1^3} \quad (12)$$

As an example, for a typical substrate (t=3 mm, $n_1$=1.453 (SiO$_2$) at $\lambda_0$)=800 nm), $\varphi$=15°, and a 3.21 µm-pitch mask 12 Eq. (11) gives $\Delta z_{substr.}^{sph.aberr.}$ ~37 µm for m=1, ~33 µm for m=2, and ~25 µm for m=3. It is clear that $\Delta z_{substr.}^{sph.aberr.}$ significantly exceed the theoretical confocal parameter $Z_0 \approx 2\lambda_0 \cos(\theta_m)/[\pi \sin^2(\varphi)]$, which is ~7.4 µm for m=1, ~6.6 µm for m=2, and ~5.0 µm for m=3.

Figure 5:
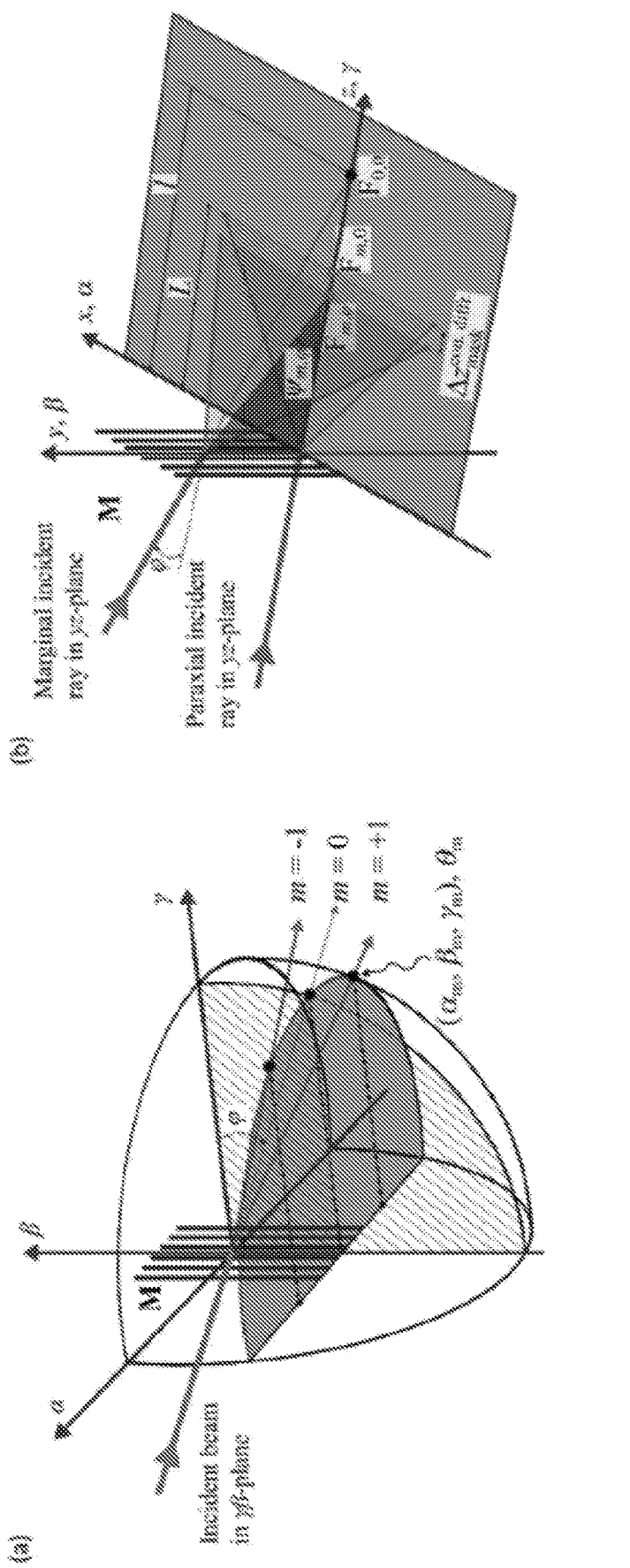
FIG. 5a depicts the visualization of the direction cosine space for conical diffraction by a phase mask (i.e., transmission diffraction grating).
FIG. 5b depicts the ray propagation in the yz-plane plane (βγ-plane in FIG. 5a) leading to the focal elongation.

The generic grating equation $m\lambda_0 = \Lambda_M \sin(\theta_m)$, used above, is valid when the incident and diffracted rays lie in a plane that is perpendicular to the grooves (i.e., in-plane diffraction). However, certain FBG inscription scenarios require that the laser beam be tightly focused, which implies that rays of the incident light are no longer perpendicular to the grooves. This type of diffraction is called off-plane diffraction or conical diffraction. The term 'conical diffraction' emphasizes the fact that in the case of off-plane incidence the diffracted light corresponding to different diffraction orders lies on a conical surface. To visualize the behavior of diffraction orders produced by an off-plane incident beam, Harvey et al in Applied Optics, vol. 42 no. 7, pg. 1167-1174 (2003), introduced direction cosines of the actual spatial coordinates to describe both the incident and diffracted rays (FIG. 5a). According to this formalism, the absolute values of the direction cosines of the incident ray are given by:

$$\alpha_i = \sin(\chi)\cos(\varphi); \ \beta_i = \sin(\varphi); \ \gamma_i = \cos(\chi)\cos(\varphi) \text{ with } \alpha_i^2 + \beta_i^2 + \gamma_i^2 = 1 \quad (13)$$

where $\chi$ is the in-plane angle of incidence. The absolute values of the direction cosines of the ray diffracted into the $m^{th}$ order can be found from:

$$\alpha_m - \alpha_i = m\lambda_0/\Lambda_M, \ \alpha_m = \sin(\theta_m)\cos(\varphi); \beta_m = B_i = \sin(\varphi)$$
$$\text{with } \alpha_m^2 + \beta_m^2 + \gamma_m^2 = 1 \quad (14)$$

In one embodiment, the azimuthal angle is $\chi$=0, while the polar angle $\varphi$ represents the angle at which the marginal rays (FIGS. 4 and 5) impinge the mask substrate and the grooves on the mask 12. The spatial spectrum of propagating (i.e., nonevanescent) diffraction orders is defined by the condition $\alpha_m^2 + \beta_m^2 \leq 1$.

For $\chi$=0 (FIG. 5b), $\gamma_m$ and $\tan(\psi_{m,\varphi})$ can be written as:

$$\gamma_m = [1 - m^2\lambda_0^2/\Lambda_M^2 - \sin^2(\varphi)]^{1/2}; \ \tan(\psi_{m,\varphi}) = \sin(\varphi)[1 - m^2\lambda_0^2/\Lambda_M^2 - \sin^2(\varphi)]^{-1/2} \quad (15)$$

The z-coordinate $z_{m,\varphi}$ of the focal line produced by diffracted marginal rays (i.e., point $F_{m,\varphi}$ in FIG. 5b) is given by $z_{m,\varphi} = l\tan(\varphi)\tan^{-1}(\psi_{m,\varphi})$, where l is the distance from the back surface of mask 12 to the $0^{th}$-order paraxial focus $F_{0,0}$. On the other hand, the z-coordinate $z_{m,0}$ of the focal line produced by diffracted paraxial rays (i.e., point $F_{m,0}$ in FIG. 5b) is given by $z_{m,0} = l\cos(\theta_m)$. Finally, the distance $\Delta z_{mask}^{con.diffr.} = z_{m,0} - z_{m,\varphi}$ along the z-axis between the marginal focus $F_{m,\varphi}$ and the paraxial focus $F_{m,0}$ corresponding to the $m^{th}$ diffraction order can be expressed as:

$$\Delta z_{mask}^{con.diffr.} = L\left\{1 - \left[\frac{\cos^2(\varphi) - m^2\lambda_0^2/\Lambda_M^2}{\cos^2(\varphi)(1 - m^2\lambda_0^2/\Lambda_M^2)}\right]^{1/2}\right\} \quad (16)$$

where L=l/cos($\theta_m$) is the distance from the back surface of mask 12 to the paraxial focus $F_{m,0}$, as defined in FIG. 5b. When $\varphi$ is small (i.e., in the $3^{rd}$-order approximation), Eq. (16) can be presented in a more compact form:

$$\Delta z_{mask}^{con.diffr.} = \frac{m^2\lambda_0^2 L\varphi^2}{2(\Lambda_M^2 - m^2\lambda_0^2)} \quad (17)$$

As above, the geometric optics formalism used to derive Eq. (16) yields no information about the intensity distribution in the focal volume and only defines two shadow boundaries on the z-axis between which the light rays cross the z-axis.

To summarize, some key features of spherical aberration induced by the mask substrate and an aberration originating from off-plane diffraction by the mask 12 are as follows:

First, the focal elongations $\Delta z_{substr.}^{sph.aberr.}$ and $\Delta z_{mask}^{con.diffr.}$ do not depend on $\Delta\lambda$ and therefore should be taken into account during FBG inscription irrespective of the laser source.

Second, for a given material (and diffraction order m), $\Delta z_{substr.}^{sph.aberr.}$ nonlinearly depends on the focusing angle $\varphi$ (i.e., $\propto\varphi^2$) and linearly depends on the substrate thickness t.

Third, $\Delta z_{mask}^{con.diffr.}$ is proportional to $\varphi^2$ and linearly depends on the distance L from the mask 12. Similar to $\Delta z_{mask}^{chrom.}$ (compare Eq. (8) and Eq. (17)), the dependence of $\Delta z_{mask}^{con.diffr.}$ on the diffraction angle $\theta_m$ is nonlinear. Based on the above ray optics analysis (Eq. (16)), the focal elongation caused by conical diffraction is expected to be quite significant. For instance, for a 3.21 μm-pitch mask 12, $\lambda_0$=800 nm and $\varphi$=15°, $\Delta z_{mask}^{con.diffr.}$ increases by ~0.2 μm for m=1, ~1.2 μm for m=2, and ~4.7 μm for m=3 when the observation point is moved every 100 μm away from the mask 12.

Fourth, if the chromatic effects considered above are ignored, there exists a distance L from the mask 12 where $|\Delta z_{substr.}^{sph.aberr.}|=|\Delta z_{mask}^{con.diffr.}|$ and the confocal parameter of the line-shaped fs-laser focus attains its minimum value. For given m and $\lambda_0$, this distance is solely determined by the mask parameters and in the 3$^{rd}$-order approximation does not depend on $\varphi$. However, the cancelation of the two counteracting aberrations at a certain L would lead to a more pronounced sharpening of the fs-beam focus for larger $\varphi$'s, that is for tight-focusing geometries.

Fifth, there exists a distance L from the mask 12 where the conditions $|\Delta z_{substr.}^{sph.aberr.}|=|\Delta z_{mask}^{con.diffr.}|$ and $|\Delta z_{mask}^{chrom.}|=|\Delta z_{lens}^{chrom.}|$ can be fulfilled simultaneously, which is expected to result in a stronger maximum in the focal peak intensity $I_0'$ than in the case when these conditions are separately met at different L's. This can be achieved, for example, by first fulfilling the condition $|\Delta z_{mask}^{chrom.}|=|\Delta z_{lens}^{chrom.}|$ and then choosing the mask thickness t that would fulfill the condition $|\Delta z_{substr.}^{sph.aberr.}|=|\Delta z_{mask}^{con.diffr.}|$.

Experimental Results

A Ti-sapphire regeneratively amplified laser system operating at a central wavelength of $\lambda_0$=800 nm, was used in experiments implementing embodiments set forth herein. The bandwidth (FWHM) and output beam diameter (at the 1/e$^2$-intensity level) of the fs-system were $\Delta\lambda$~6 nm and 2$w_0$~7 mm, wherein an interference filter was placed in the regenerative amplifier's beam to reduce the original 14 nm bandwidth to the 6 nm bandwidth. The phase mask used had a mask pitch of 1.07 μm and was 2.1 mm thick. To reconstruct 3D time-averaged intensity distributions after the mask, the technique described in Hnatovsky et al. Optics Express vol. 25 no. 13 pg. 14247-14259 (2017) was employed. Briefly, the respective xy-intensity distributions with a 1 μm separation along the z-axis were projected onto a CMOS matrix by means of a high numerical aperture (i.e., NA=0.9) objective lens, recorded and combined into 3D stacks. The yz-intensity distributions shown in FIGS. 6, 7 and 8 were obtained by averaging the values of points with fixed ($y_i$, $z_i$)-coordinates along the x-axis and projecting the respective mean values onto the yz-plane.

Figure 6:
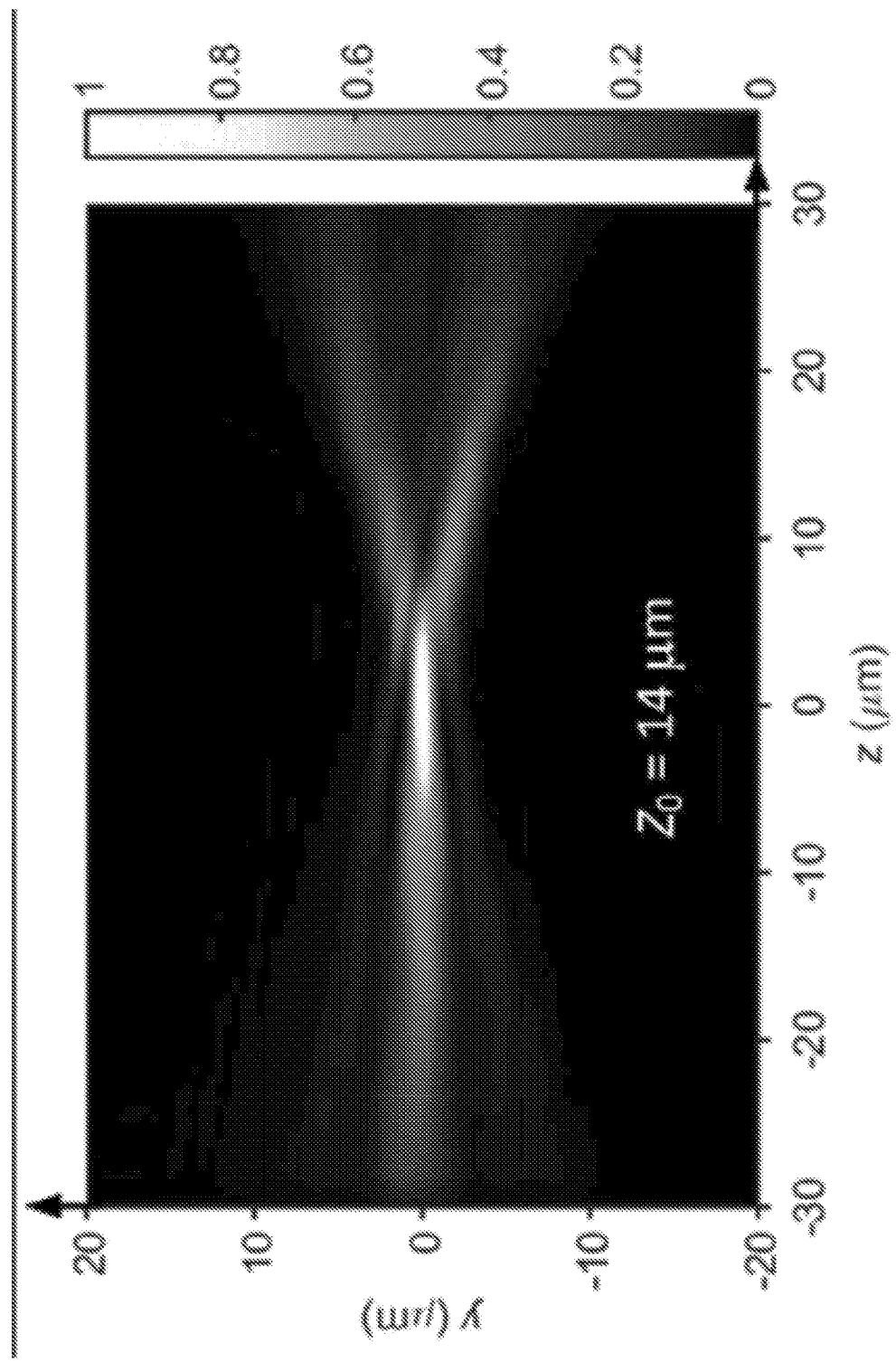
FIG. 6 shows the focal intensity distribution in the yz-plane of an 80 fs, 800 nm wavelength beam with a beam diameter $2w_0 \sim 7$ mm that is focused in free space with a 12 mm focal-length cylindrical lens corrected for spherical aberration, where the beam propagation is from left to right.

To estimate the quality of the focusing optic and the output beam from the regenerative amplifier, the phase mask was initially removed from the beam path. FIG. 6 shows the focal intensity distributions of the output beam in the yz-plane when the beam is focused with the 12 mm-focal-length cylindrical lens corrected for spherical aberration 11 (hereinafter cylindrical lens 11) as described previously. The effective numerical aperture of the cylindrical lens (i.e., sin($\varphi$)) is estimated at 0.26. Under such conditions, aberration-free focusing of quasi-monochromatic light at $\lambda_0$=800 nm would translate into a 7.6 μm confocal parameter (i.e., $Z_0$~7.6 μm) for sin($\varphi$)=0.26. As mentioned above, the curved surface of the cylindrical lens is designed to correct spherical aberration in one dimension. However, the focal shape indicates that the lens still introduces a certain amount of negative spherical aberration, i.e., the marginal rays are focused farther from the lens than the paraxial ones. The effect of chromatic aberration can be deduced from FIG. 6 by measuring the confocal parameter $Z_0$, which is ~14 μm. For reference, Eq. (6) gives $\Delta z_{lens}^{chrom.}$~3.4 μm.

Figure 7:
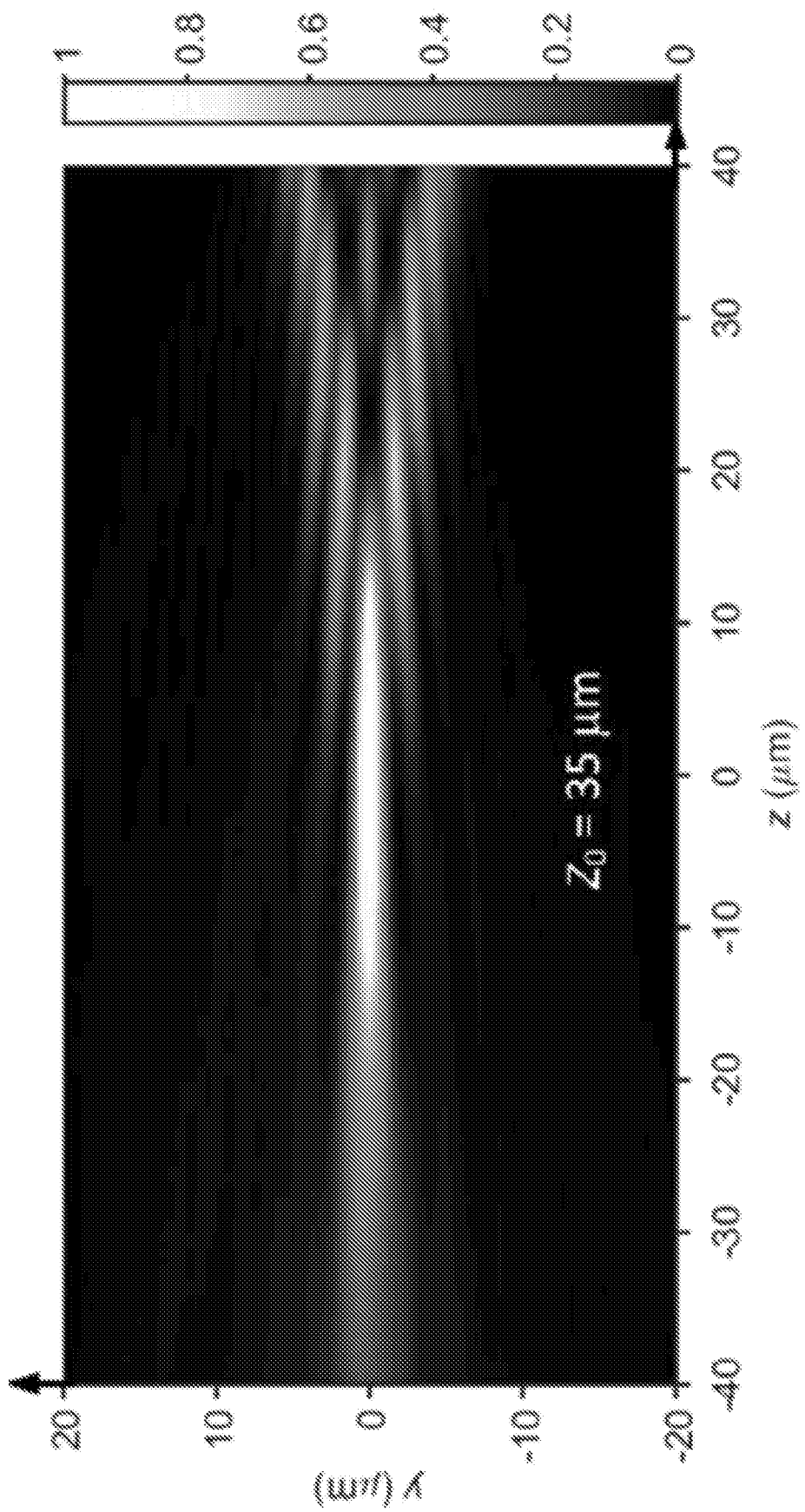
FIG. 7 shows the focal intensity distribution in the yz-plane of the laser beam shown in FIG. 6 when the beam is focused (with the 12 mm focal-length cylindrical lens corrected for spherical aberration) through a phase mask substrate with a thickness of 2.1 mm.
Figure 8:
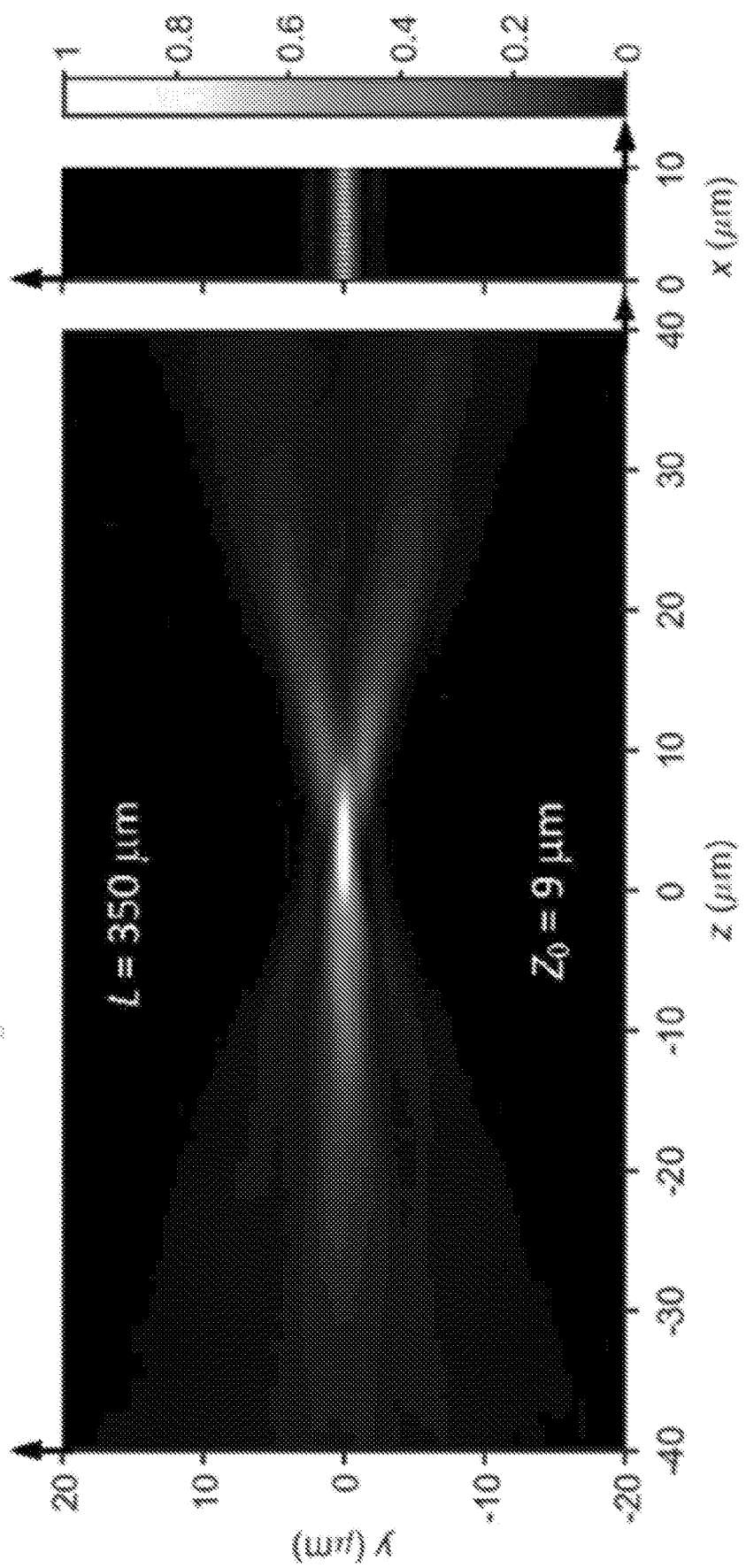
FIG. 8 shows the focal intensity distribution at the optimal distance from the phase mask in the yz-plane and the xy-plane of the laser pulse shown in FIG. 6 and FIG. 7 when the beam is focused (with the 12 mm focal-length cylindrical lens corrected for spherical aberration) through a phase mask having a pitch of 1.071 μm.

The effect of substrate-induced spherical aberration for the 2.1 mm thick substrate is demonstrated in FIG. 7, where the fs-beam was focused through the mask substrate without intercepting the phase mask grooves. Analysis of the respective yz-intensity distributions in FIG. 7 confirms that the substrate-induced negative spherical aberration significantly elongates the focal volume. The measured $Z_0$ is presented in FIG. 7. For reference, longitudinal substrate-induced spherical aberration $\Delta z_{substr.}^{sph.aberr.}$ given by Eq. (9) is ~42 μm for t=2.1 mm when sin($\varphi$)=0.26. It should be noted that the above value for $\Delta z_{substr.}^{sph.aberr.}$ provides only a rough estimate as it defines only two shadow boundaries on the z-axis between which the light rays cross the z-axis.

Figure 9:
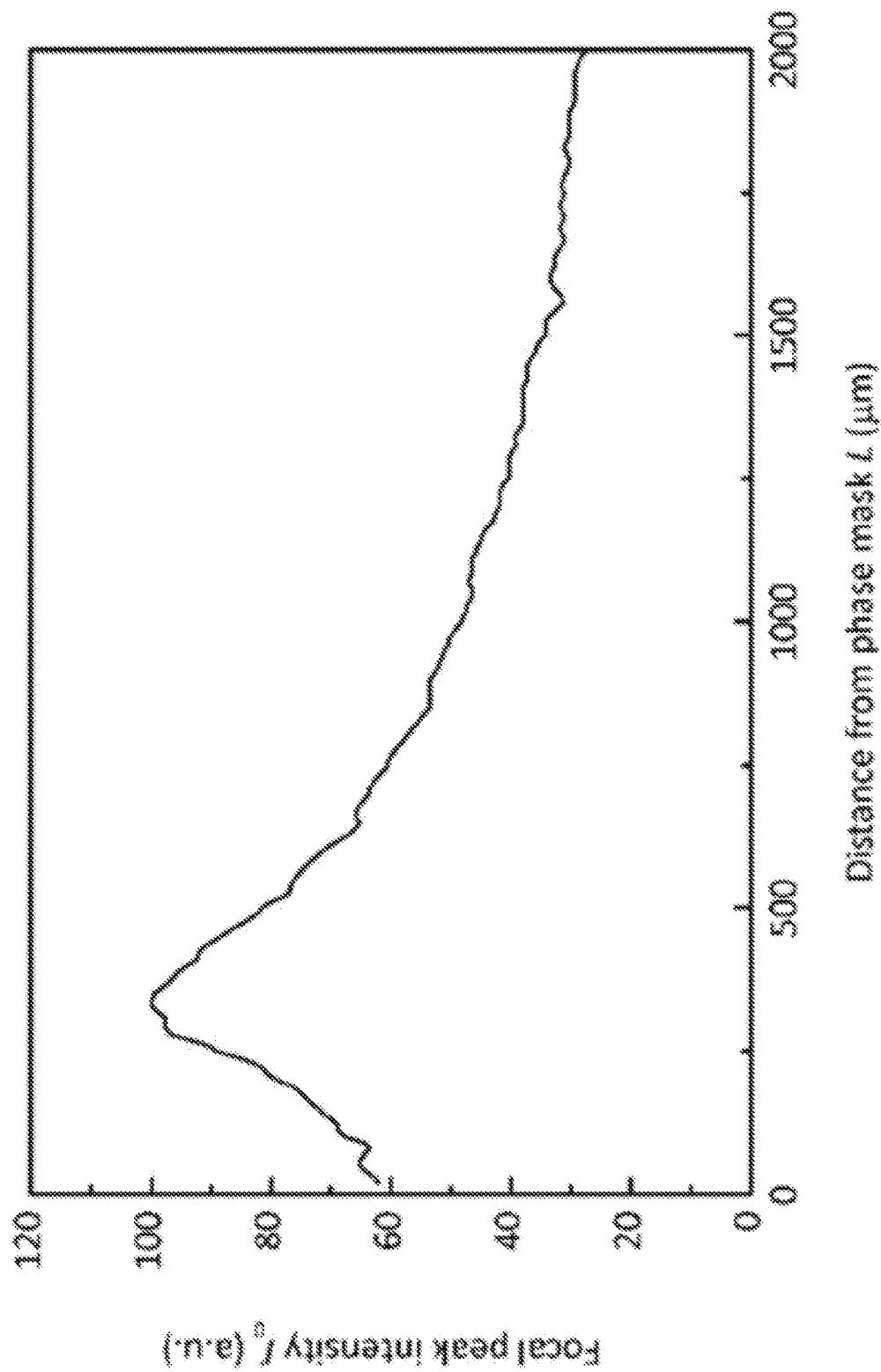
FIG. 9 shows the variation of the focal spot peak intensity as a function of distance from the mask when the beam is focused through the phase mask with the 12 mm focal length cylindrical lens corrected for spherical aberration.

The interplay of the chromatic effects, which are characterized by $|\Delta z_{mask}^{chrom.}|$ and $|\Delta z_{lens}^{chrom.}|$, and the effects associated with spherical aberration and conical diffraction, which are characterized by $|\Delta z_{substr.}^{sph.aberr.}|$ and $|\Delta z_{mask}^{con.diffr.}|$, was studied using the 1.07 μm-pitch 2.1 mm-thick mask 12. The fs-beam from the regenerative amplifier was focused through the mask grooves. The results pertinent to this experiment are presented in FIGS. 8 and 9. The plot in FIG. 9 shows the focal peak intensity $I_0'$ as a function of distance L from the mask 12, with a strong sharp maximum being located at L~350 μm. The observed variations of $I_0'$, with L can also be correlated with the transformations occurring with the focal intensity distributions in the yz-plane. Substrate-induced negative spherical aberration is quite strong at L=100 μm, almost neutralized by conical diffraction at L=350 μm, and completely reversed by conical diffraction at L=900 μm. Theoretically, the distance L at which the condition $|\Delta z_{mask}^{chrom.}|=|\Delta z_{lens}^{chrom.}|$ is fulfilled does not depend on the mask thickness t and should therefore be ~240 μm. On the other hand, L, at which the condition $|\Delta z_{substr.}^{sph.aber.}|=|\Delta z_{mask}^{con.diffr.}|$ is fulfilled, linearly depends on t and is thus expected to be ~380 μm. This data provides evidence that the sharp maximum in FIG. 9 is mainly caused by the compensation of substrate-induced spherical aberration by conical diffraction. After the maximum, i.e. at larger distances from the mask 12, the evolution of the focal intensity distribution is governed by the combined action of chromatic dispersion and conical diffraction originating from the mask 12.

A final set of experiments investigated whether the focal peak intensity plots can be used as a guide for through-the-coating FBG inscription in terms of maximizing the fs-light intensity at the fiber core and minimizing it at the fiber surface, i.e. at the coating.

First, uncoated SMF-28 fiber samples were placed at different distances L from a 1.07 μm-pitch mask 12 that was 2.1 mm in thickness and exposed to radiation from the regenerative amplifier. The femtosecond beam was focused with the 12 mm-focal-length cylindrical lens 11 with an effective numerical aperture of sin($\varphi$)=0.26, as above. During the inscription the cylindrical lens was scanned with a piezo actuator perpendicular (i.e., along the y-axis) to the fs-beam in order to maximize the overlap of the fs-laser-induced modification with the fiber core. For each sample, the laser fluence was kept at the same level.

Figure 10:
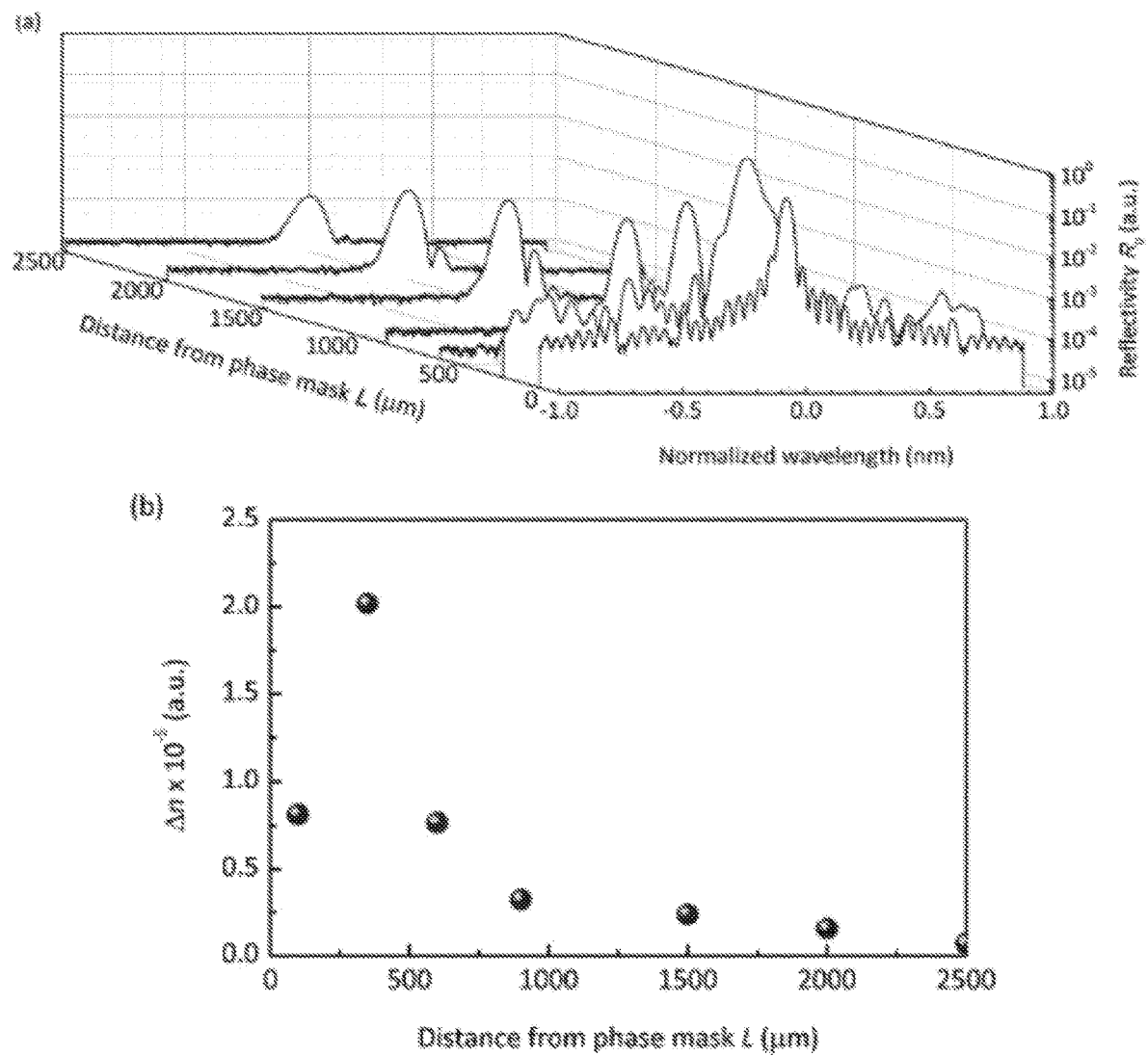
FIG. 10a shows reflection spectra of Type I FBGs written (with the 12 mm focal-length cylindrical lens corrected for spherical aberration) in uncoated SMF-28 fiber at different separations between the phase mask and the fiber.
FIG. 10b shows the inferred refractive index change for the corresponding Type I FBGs.

FIG. 10 shows that the FBG strength does follow the focal peak intensity plot shown in FIG. 7. This trend can be seen even more clearly in FIG. 10b, where the induced change $\Delta n$ in the refractive index of the fiber core is plotted as a function of L. In order to deduce $\Delta n$ from the FBG strength, the well-known expression for the peak reflectivity $R_0$ of a uniform FBG with a constant sinusoidal modulation was used:

$$R_0 \approx \tanh^2[\pi \Delta n W' n(V)/\lambda_B] \quad (18)$$

In Eq. (18), W is the FBG length, $\lambda_B$ is the Bragg wavelength given by $\lambda_B = n\Lambda_M$ (n is the refractive index of the fiber core), and $n(V) \approx 1 - 1/V^2$, $V \approx 2.4$ is a function of the fiber parameter V that represents the fraction of the integrated fundamental-mode power in the core. In this experiment, the FBGs were written with the expanded quasi-flat-top beam, as described earlier in the text. For each distance from the mask L, the effect of transverse walk-off was taken into account in the calculations by adjusting the grating width W according to $W' \approx W_0 - \Delta_T = W_0 - 2L \tan(\theta_m)$, where $W_0$ is the FBG length when the fiber touches the mask ($W_0 \sim 13$ mm, as defined by the clear aperture of the cylindrical lens 11 along x).

Figure 11:
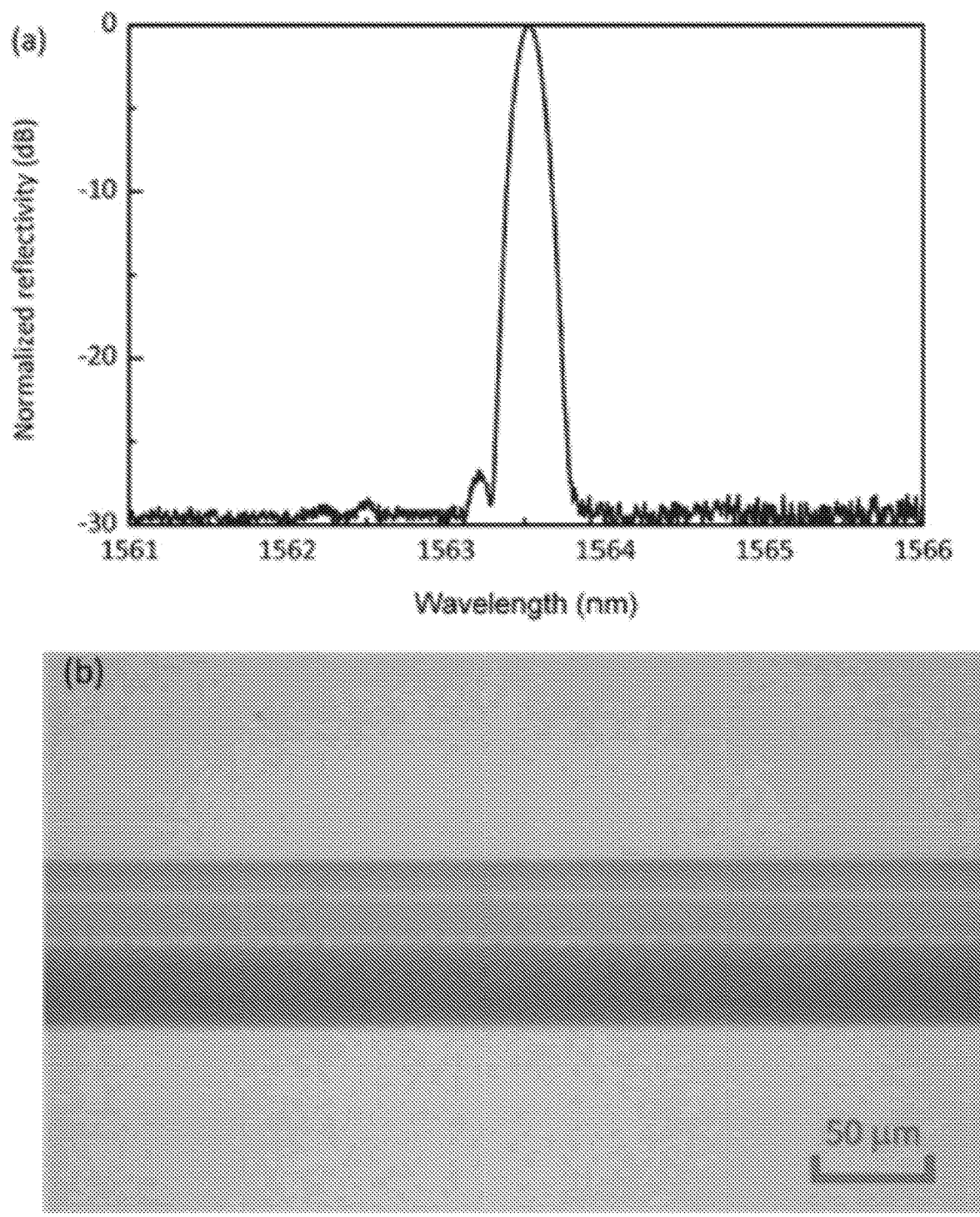

Next, approximately 5 mm-long Type-I gratings were written in polyimide-coated 50 µm fibers (51.2 µm exactly). It is important to note that the fibers were not hydrogen/deuterium-loaded. According to the manufacturer (FIBERCORE), the germanosilicate core has a diameter of 4.1 µm, and the polyimide coating is approximately 10 µm-thick. The 50 µm-fiber was placed 350 µm away from the 1.07 µm-pitch 2.1 mm-thick mask 12 and exposed to the radiation from the regenerative amplifier. The beam was focused with the 12 mm-focal-length cylindrical lens 11 with an effective numerical aperture of $\sin(\varphi)=0.26$. During the exposure the cylindrical lens was scanned perpendicular to the fs-beam. The pertinent results are demonstrated in FIG. 11. It should be noted that writing in polyimide-coated 50 µm-fibers was possible only within a narrow range (250 µm<L<450 µm) of fiber-to-mask distances around the optimum L=350 µm.

The experimental results agree with the predictions and estimates based on the semi-quantitative analysis above, where the chromatic effects were presented in terms of only two different wavelength (i.e., 'blue' and 'red') and monochromatic aberrations were introduced as ray optics phenomena.

Specifically, the simple analytic expressions given in Eqs. (3) through (17) give the distance from the mask 12 where i) spherical aberration introduced by the plane-parallel mask substrate is cancelled out by conical diffraction and ii) chromatic aberration of the cylindrical lens 11 is cancelled out by chromatic dispersion of the mask. When these two distances are approximately equal, a dramatic sharpening of the laser focus and the accompanying growth of focal light intensity take place. For a 1.07 µm-pitch mask 12, the agreement between theory and experiment is within a few tens of micrometers. Most importantly, the strength of FBGs (FIGS. 11a and b) recorded at a fixed fluence but different distances from the mask follows the focal peak intensity curve measured in free space (FIG. 9).

The formalism presented above provides qualitative information about i) the intensity distribution in the line-shaped focal volume and ii) temporal pulse distortions caused by the rather complex optical setup, i.e., a combination of an cylindrical lens 11, a plane-parallel plate 41 and a transmission phase diffraction grating. To calculate the temporal and spatial distribution of the electric field in the focal volume, diffraction needs to be taken into account, as set forth in the prior art. However, it should be noted that a fully rigorous treatment of the problem should also include the electromagnetic diffraction of light focused through the highly curved cylindrical surface of the fiber. Even if the diffraction integrals describing the whole system could be derived in a practically usable form, the beam quality factor (i.e., $M^2$) of the regeneratively amplified fs-system and residual aberrations of the cylindrical lens 11 would still remain unknown. In view of the above, the semi-quantitative formalism set forth above reinforced with intensity distribution measurements after the mask 12 provides an important shortcut to identify optimum FBG laser writing conditions when the phase mask technique is used.

Two independent sets of effects have been considered that are inherent to the phase mask technique, namely i) chromatic dispersion of the mask 12, which is counteracted by chromatic aberration of the cylindrical lens 11, and ii) conical diffraction by the mask, which is counteracted by spherical aberration introduced by the plane-parallel mask substrate. The interplay of these effects in the case of large diffraction angles (~48°; 1.07 µm-pitch mask) and tight focusing leads to a distinctive maximum in the distribution of focal peak intensity as a function of distance from the mask 12. For a given laser central wavelength and bandwidth, the position of this maximum from the mask generally depends on the mask substrate (thickness, refractive index), focusing cylindrical lens 11 (focal distance, refractive index), and diffraction angle of the mask (mask period). Under experimental conditions, which are typical of fs-laser inscription of fiber Bragg gratings, the position of the maximum is essentially determined by the cancellation of spherical aberration by conical diffraction. In this respect, the distance from the mask 12 can be tuned to the maximum of focal peak intensity by simply choosing a different substrate thicknesses, with the other parameters being kept fixed. This is especially true for relatively narrowband laser sources.

After the maximum has been passed, the combined action of chromatic dispersion and conical diffraction introduced by the phase mask 12 gradually decrease the peak intensity inside the focal volume of the cylindrical lens 11 by stretching the focal volume along the beam propagation direction. Focal elongation caused by chromatic dispersion 1.5-2 mm away from the mask is so strong that through-the-coating inscription becomes impossible because of fs-radiation damage to the coating. Conversely, through-the-coating inscription inside very thin fibers (50 µm cladding) when they are placed at the optimum position from the mask 12 becomes a readily achievable task even if the fibers are not hydrogen/deuterium-loaded to increase their photosensitivity.

The above chromatic and conical diffraction effects non-linearly scale down as the diffraction angle is decreased and thus become barely noticeable when the diffraction angle is ~22° (2.14 µm-pitch mask). Taking into account that chromatic aberration of the focusing cylindrical lens 11 is generally small and negative spherical aberration introduced by the mask substrate can be relatively easily compensated, working with small diffraction angles provides a convenient laser-writing technique in terms of its weak dependence on the distance from the mask 12. However, it should be remembered that the use of small diffraction angles implies that the resultant Bragg grating utilizes a higher-order resonance, which reduces the grating strength for a fixed grating length.

In addition, even though the geometric optics approach set forth above provides guidance regarding the distance from the mask 12 where the maximum in the distribution of focal peak intensity should be located, the use of complimentary diagnostic techniques to characterize the intensity distribution after the mask is important for obtaining accurate results for a given laser-writing setup.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method for inscribing a Bragg grating in an optical waveguide, comprising the steps of:
   providing electromagnetic radiation from an ultrashort pulse duration laser;
   providing a focusing optical element to focus the electromagnetic radiation from an ultrashort pulse duration laser;
   providing a diffractive optical element that when exposed to the focused electromagnetic radiation generates a beam on the optical waveguide having an interference pattern, said diffractive optical element having a substrate;
   positioning the optical fiber at a distance with respect to the diffractive optical element where the confocal parameter of a line-shaped laser focus created by the focusing optical element is smallest and the peak intensity in the focus is highest due to substantial or complete cancelation of i) chromatic aberration of the diffractive optical element ($\Delta z_{mask}^{chrom.}$) and chromatic aberration of the focusing optical element ($\Delta z_{lens}^{chrom.}$) and ii) negative spherical aberration caused by the substrate of the diffractive optical element ($\Delta z_{substr.}^{sph.aberr.}$) and conical diffraction caused by the diffractive optical element ($\Delta z_{mask}^{con.diffr.}$); and
   irradiating the optical waveguide with the electromagnetic radiation to form a Bragg grating, the electromagnetic radiation incident on the optical waveguide being sufficiently intense to cause Type I or Type II permanent change in the index of refraction within a core of the optical waveguide when exposed to a single pulse or a succession of laser pulses.

2. The method of claim 1, wherein the electromagnetic radiation has a pulse duration of less than or equal to 5 picoseconds.

3. The method of claim 1, wherein the wavelength of the electromagnetic radiation is in a range from 150 nm to 2.0 microns.

4. The method of claim 1, further comprising providing a focusing element corrected for spherical aberration for focusing the electromagnetic radiation on the diffractive optical element.

5. The method of claim 4, further comprising scanning the focusing element corrected for spherical aberration for focusing the electromagnetic radiation using a piezo actuator.

6. The method of claim 1, further comprising providing a cylindrical lens corrected for spherical aberration for focusing the electromagnetic radiation on the diffractive optical element.

7. The method of claim 6, further comprising scanning the cylindrical lens corrected for spherical aberration focusing the electromagnetic radiation using a piezo actuator.

8. The method of claim 1, wherein the distance with respect to the diffractive optical element is a distance at which the condition $|\Delta z_{mask}^{chrom.}|=|\Delta z_{lens}^{chrom.}|=|\Delta z_{lens}^{chrom.}|$ is fulfilled simultaneously.

9. The method of claim 8, wherein after the condition $|\Delta z_{mask}^{chrom.}|=|\Delta z_{lens}^{chrom.}|$ is fulfilled, choosing a thickness of the diffractive optical element that fulfils the condition $|\Delta z_{substr.}^{sph.aberr.}|=\Delta z_{mask}^{con.diffr.}|$.

10. Apparatus for inscribing a Bragg grating in an optical waveguide, comprising:
    an ultrashort pulse duration laser for providing electromagnetic radiation;
    a focusing optical element to focus the electromagnetic radiation from an ultrashort pulse duration laser; and
    a diffractive optical element that when exposed to the focused electromagnetic radiation from the focusing element produces an interference pattern in the optical waveguide:
    wherein positioning the optical waveguide at a distance with respect to the diffractive optical element along the propagation direction of the electromagnetic radiation where the confocal parameter of line-shaped laser focus is smallest and the peak intensity in the focus is highest results in the effects of i) negative spherical aberration and conical diffraction caused by the diffractive optical element and ii) chromatic aberration of the focusing element and chromatic dispersion of the diffractive optical element substantially or completely cancelling each other out; and
    wherein irradiating the optical waveguide with the electromagnetic radiation forms a Bragg grating, the electromagnetic radiation incident on the optical waveguide being sufficiently intense to cause Type I or Type II permanent change in the index of refraction within a core of the optical waveguide when exposed to a single pulse or a succession of laser pulses.

11. The apparatus of claim 10, wherein the optical waveguide is a polymer-coated optical fiber.

12. The apparatus of claim 10, wherein the optical waveguide is a polymer-coated non-photosensitized optical fiber.

13. The apparatus of claim 10, wherein the optical waveguide is an optical fiber with a diameter less than or equal to 50 μm.

14. The apparatus of claim 10, wherein the optical waveguide is a non-photosensitized (no hydrogen or deuterium loading) optical fiber with a diameter less than or equal to 50 μm.

15. The apparatus of claim 10, wherein the optical waveguide is a polymer-coated optical fiber with a diameter less than or equal to 50 μm.

16. The apparatus of claim 10, wherein the optical waveguide is a polymer-coated non-photosensitized optical fiber with a diameter less than or equal to 50 μm.

17. The apparatus of claim 10, wherein the optical waveguide is a buried channel waveguide.

18. The apparatus of claim 10, wherein the optical waveguide is a ridge waveguide.

19. The apparatus of claim 10, wherein the optical waveguide is a tapered optical fiber.

20. The apparatus of claim 10, wherein the electromagnetic radiation has a pulse duration of less than or equal to 5 picoseconds.

21. The apparatus of claim 10, wherein the wavelength of the electromagnetic radiation is in a range from 150 nm to 2.0 microns.

22. The apparatus of claim 10, wherein the ultrashort pulse duration laser comprises a Ti-sapphire regeneratively amplified laser system operating at a central wavelength of 800 nm.

23. The apparatus of claim 10, wherein the diffractive optical element comprises a uniformly pitched phase mask.

24. The apparatus of claim 10, wherein the diffractive optical element comprises a chirped phase mask.

25. The apparatus of claim 10, wherein the diffractive optical element comprises a phase-shifted phase mask.

26. The apparatus of claim 10, further comprising providing a focusing element corrected for spherical aberration for focusing the electromagnetic radiation on the diffractive optical element.

27. The apparatus of claim 26, further comprising providing a piezo actuator for scanning the focusing element corrected for spherical aberration for focusing the electromagnetic radiation.

28. The apparatus of claim 10, further comprising providing a cylindrical lens corrected for spherical aberration for focusing the electromagnetic radiation on the diffractive optical element.

29. The apparatus of claim 28, further comprising a piezo actuator for scanning the cylindrical lens corrected for spherical aberration for focusing the electromagnetic radiation using a piezo actuator.

30. The apparatus of claim 10, wherein the optical waveguide is an optical fiber.

31. The apparatus of claim 10, wherein the optical waveguide is a non-photosensitized optical fiber.

\* \* \* \* \*